(12) United States Patent
Yamazaki

(10) Patent No.: US 6,882,102 B2
(45) Date of Patent: Apr. 19, 2005

(54) LIGHT EMITTING DEVICE AND MANUFACTURING METHOD THEREOF

(75) Inventor: Shunpei Yamazaki, Tokyo (JP)

(73) Assignee: Semiconductor Energy Laboratory Co., Ltd. (JP)

( * ) Notice: Subject to any disclaimer, the term of this patent is extended or adjusted under 35 U.S.C. 154(b) by 73 days.

(21) Appl. No.: 09/793,897

(22) Filed: Feb. 28, 2001

(65) Prior Publication Data

US 2001/0017517 A1 Aug. 30, 2001

(30) Foreign Application Priority Data

Feb. 29, 2000 (JP) .................................... 2000-055020

(51) Int. Cl.[7] .............................. H01J 1/62; H01J 63/04
(52) U.S. Cl. ...................................................... 313/504
(58) Field of Search ................................ 313/498, 500, 313/501, 504, 506; 257/72, 88

(56) References Cited

U.S. PATENT DOCUMENTS

| 5,550,066 A | * | 8/1996 | Tang et al. | .......... 257/E21.703 |
| 5,719,467 A | | 2/1998 | Antoniadis et al. | |
| 5,885,498 A | | 3/1999 | Matsuo et al. | |
| 5,895,692 A | * | 4/1999 | Shirasaki et al. | ............ 427/557 |
| 6,075,316 A | | 6/2000 | Shi et al. | |
| 6,346,717 B1 | * | 2/2002 | Kawata | ....................... 257/72 |
| 6,416,885 B1 | | 7/2002 | Towns et al. | |
| 6,423,429 B1 | | 7/2002 | Kido et al. | |
| 6,597,121 B1 | | 7/2003 | Imura | |
| 6,630,784 B1 | * | 10/2003 | Yoneda | ....................... 313/504 |
| 2001/0026123 A1 | | 10/2001 | Yoneda | |
| 2002/0180372 A1 | | 12/2002 | Yamazaki | |

FOREIGN PATENT DOCUMENTS

| JP | 3224459 | | 3/1995 | | |
| JP | 10047565 A | * | 2/1998 | .......... P16L/23/036 |
| JP | 11-251067 | | 9/1999 | | |
| JP | 11251069 A | * | 9/1999 | .......... H05B/33/26 |
| JP | 2000-244079 | | 9/2000 | | |
| JP | 3203227 | | 6/2001 | .......... H05B/33/10 |

* cited by examiner

*Primary Examiner*—Nimeshkumar D. Patel
*Assistant Examiner*—Peter Macchiarolo
(74) *Attorney, Agent, or Firm*—Fish & Richardson P.C.

(57) ABSTRACT

A light emitting device having superior responsibility is provided. A pixel electrode (anode) connected to a drain wiring of an current control TFT has a slit. The slit becomes a path for light emitted from an EL layer, and emitted light can be extracted using a light shielding metallic film as the pixel electrode. A material having a low resistance can thus be used as the pixel electrode, and therefore a light emitting device having superior responsibility can be obtained.

46 Claims, 14 Drawing Sheets

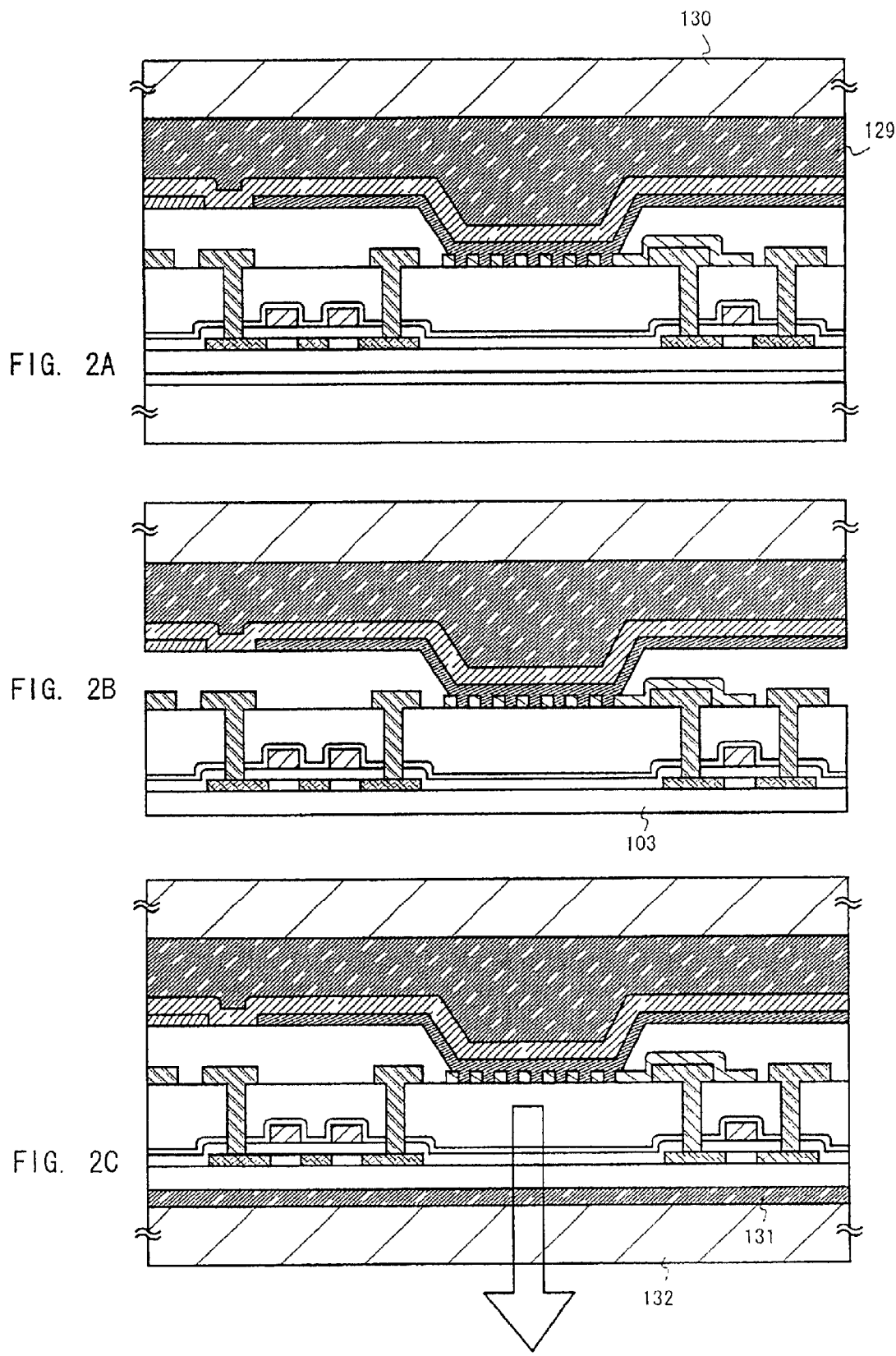

LIGHT EMITTING DEVICE AND MANUFACTURING METHOD THEREOF

BACKGROUND OF THE INVENTION

1. Field of the Invention

The present invention relates to a device having an element in which a light emitting material is sandwiched between electrodes (hereafter referred to as a light emitting element), and to a method of manufacturing thereof. In particular, the present invention relates to a light emitting device using a light emitting element which utilizes a light emitting material in which EL (electro luminescence) is obtained as the light emitting material (hereafter referred to as an EL light emitting device, an EL element, and an EL material, respectively).

Note that EL materials which can be used in the present invention include all light emitting materials in which light is emitted via singlet state excitation, triplet state excitation, or both types of excitation (phosphorescence and/or fluorescence).

2. Description of the Related Art

Development of EL light emitting devices has advanced in recent years. An EL light emitting device is structured by an EL element in which an EL material is sandwiched between an anode and a cathode. By applying a voltage between the anode and the cathode and making an electric current flow in the EL material, the carrier is made to recombine and light is emitted. Namely, the light emitting element itself has the ability to emit light, and therefore a backlight such as that used in a liquid crystal display device is unnecessary in EL light emitting devices. In addition, EL light emitting devices have the advantages of wide viewing angle, light weight and low electric power consumption.

Conductive films having a large work function, typically transparent conductive oxide films, are used as the anode of EL light emitting devices. Conductive oxide films transmit visible light, and therefore light emitted from an EL layer can be easily extracted, but conductive oxide films have the disadvantage of high resistance compared to metallic films. Not only does the injection efficiency of electric current into an EL layer become poor when the anode resistance is high, but a problem of an element having slow response arises.

Conductive oxide films are formed by evaporation or sputtering, and there are many problems such as dust or other refuse during film formation. Furthermore, there is a problem in that etching becomes difficult due to crystallization, and therefore, conductive oxide films are one of the kinds of conductive films which are difficult to handle when compared to metallic films.

However, EL light emitting device cathodes are metallic films, and therefore there is a problem in that emitted light cannot be extracted if a transparent conductive film is not used in the anode. Materials other than conductive oxide films are thus not used as anode materials at present.

SUMMARY OF THE INVENTION

An object of the present invention is to manufacture a light emitting device having an anode with low electrical resistance, having high electric current injection efficiency, and having superior response, by using a metallic film or semiconductor film with a high work function as a substitute for an conductive oxide film in the anode. Further, an object of the present invention is to provide a light emitting device having an element structure necessary in order to manufacture the light emitting device, and to provide electronic equipment using the light emitting device.

In order to use a metallic film or semiconductor film with a high work function as an anode, in the present invention, it is characterized that an electrode structure, in which a slit (a fine gap for not shielding light) is formed in the anode or a cathode of a light emitting element, for fulfilling a function as the anode or the cathode, at the same time, for securing a path for the light, is employed. The slit may be formed in the anode, and may be formed in the cathode. Further, slits may be formed in both the anode and the cathode (shown in FIG. 16). In the present invention, by using an electrode in which a slit is formed as a light path, a metallic film or a semiconductor film can be used as the anode.

Intervals of the slits (e.g. Ⓐ shown in FIG. 3A) are 0.5–3.0 μm preferably 1.0–2.0 μm and width of the slits (e.g. Ⓑ shown in FIG. 3A) are preferably 10–15 times as long as the intervals of the slit A. For example, when intervals of the slits are 1.5 μm, width of the slits are preferably 10–15 μm. Also, opening portions may be 70–90% of the electrode.

Moreover, a conductive charge injecting layer may be formed between an EL layer and an electrode having slits. For example, a polyacetylene film including iodine or boron may be formed between an anode having slits and an EL layer. The charge injecting layer also functions as a leveling layer.

The role of an anode in an EL light emitting device is to inject holes, and it is required that the anode be a material having a higher HOMO level than that of an EL material. Namely, it is preferable that the anode be a high work function material. Anodes are not limited to conductive oxide films, and provided that materials fulfill this requirement, it is also possible to use metallic films and semiconductor films. Platinum (Pt), chromium (Cr), tungsten (W), or nickel (Ni) can be used as this type of metallic film. Further, silicon (Si) or germanium (Ge) can be used as the semiconductor film. Also, an aluminum film to which lithium has been added may be used as the cathode.

The breadth of selectable materials capable of being used as an anode is increased by thus implementing the present invention, and it becomes possible to obtain a light emitting device having a driver voltage which is lower, and having an emitted light luminance which is higher, compared to a conventional light emitting device. Furthermore, it becomes possible to use metallic films and semiconductor films, whose resistance is lower than that of conductive oxide films, as an anode, and therefore a light emitting device having high electric current injection efficiency and having superior responsibility can be obtained.

BRIEF DESCRIPTION OF THE DRAWINGS

In the accompanying drawings:

FIGS. 2A to 2C are diagrams showing the process of manufacturing the light emitting device;

DETAILED DESCRIPTION OF THE PREFERRED EMBODIMENTS (Embodiment Mode)

Figure 3A:
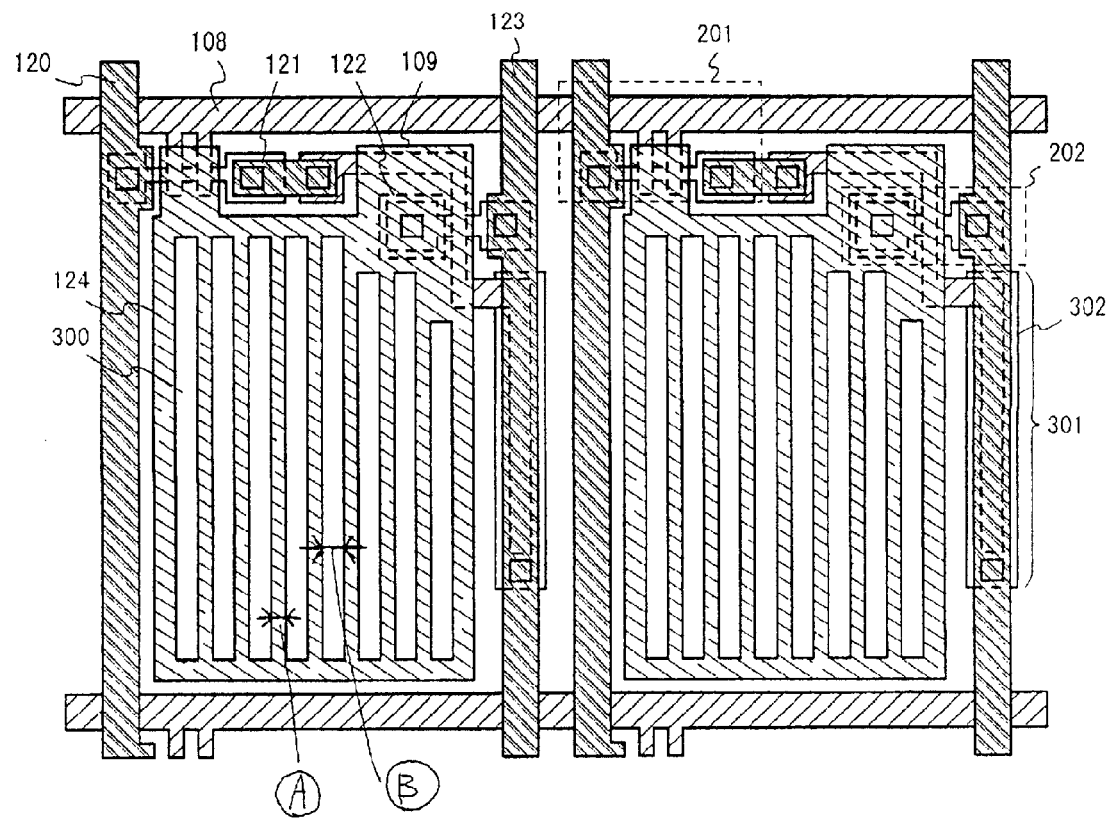
FIGS. 3A and 3B are diagrams showing a top surface structure and a circuit configuration, respectively, of a light emitting device.

An embodiment mode of the present invention is explained using FIGS. 1A to 2C. Note that cross sectional diagrams showing a process of manufacturing for a pixel portion are shown in FIGS. 1A to 2C. Further, a top view of a pixel manufactured in the embodiment mode is shown in FIG. 3A. Reference numerals used in FIGS. 3A and 3B correspond to reference numerals used in FIGS. 1A to 1E and in FIGS. 2A to 2C.

Figure 1A:
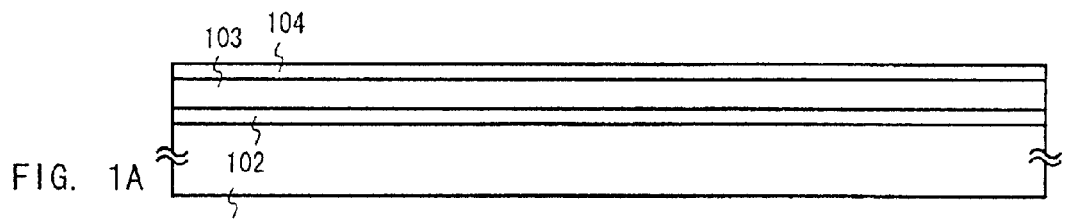
FIGS. 1A to 1E are diagrams showing a process of manufacturing a light emitting device.

In FIG. 1A, reference numeral 101 denotes a substrate upon which an element is formed (hereafter referred to as an element forming substrate), and a peeling layer 102 is formed of a non-crystalline silicon film having a thickness of 100 to 500 nm (300 nm in the embodiment mode) on the element forming substrate. A glass substrate is used as the element forming substrate 101 in the embodiment mode, but a quartz substrate, a silicon substrate, a metallic substrate, and a ceramic substrate may also be used.

Note that, throughout this specification, there are also cases of referring to an element forming substrate to indicate an overall substrate on which semiconductor elements or light emitting elements are formed.

Further, the peeling layer 102 may be formed using reduced pressure thermal CVD, plasma CVD, sputtering, or evaporation. An insulating film 103 is formed of a silicon oxide film having a thickness of 200 nm on the peeling layer 102. The insulating film 103 may be formed using reduced pressure thermal CVD, plasma CVD, sputtering, or evaporation.

A crystalline silicon film 104 is formed with a thickness of 50 nm on the insulating film 103. It is possible to use a known means as a formation method for the crystalline silicon film 104. A non-crystalline silicon film may be laser crystallized using a solid state laser or an excimer laser, and a non-crystalline silicon film may also be crystallized by heat treatment (furnace annealing).

Figure 1B:
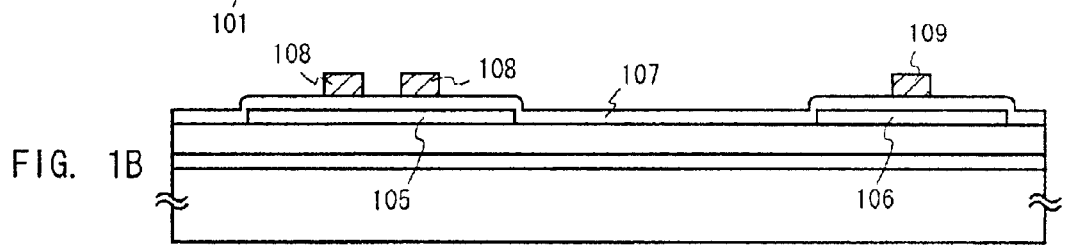

Next, as shown in FIG. 1B, the crystalline silicon film 104 is patterned, forming island shape crystalline silicon films (hereafter referred to as active layers) 105 and 106. A gate insulating film 107 is then formed of a silicon oxide film, covering the active layers. In addition, gate electrodes 108 and 109 are formed on the gate insulating film 107 at a thickness of 80 nm. A 350 nm thick tungsten film or tungsten alloy film is used as the gate electrodes 108 and 109 in the embodiment mode. Other known materials can also be used for the gate electrodes, of course.

An element residing in group 13 of the periodic table (typically boron) is then added using the gate electrodes 108 and 109 as masks. A known means may be used as the method of addition. Impurity regions showing p-type conductivity (hereafter referred to as p-type impurity regions) 110 to 114 are thus formed. Further, channel forming regions 115 to 117 are demarcated below the gate electrodes. Note that the p-type impurity regions 110 to 114 become TFT source regions or drain regions.

Figure 1C:
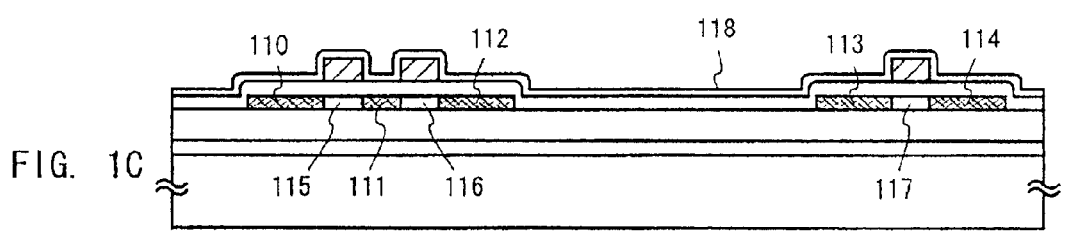

Next, as shown in FIG. 1C, a protection film (a silicon nitride film here) 118 is formed having a thickness of 50 nm, and heat treatment is then performed activating the added periodic table group 13 element. The activation may be performed in accordance with furnace annealing, laser annealing, or lamp annealing, and may also be performed using a combination of these. Heat treatment is performed for 4 hours at 500° C. in a nitrogen atmosphere in the embodiment mode.

It is effective to perform a hydrogenation process after the activation is completed. A known hydrogen annealing technique or plasma hydrogenation technique may be used for the hydrogenation process.

Figure 1D:
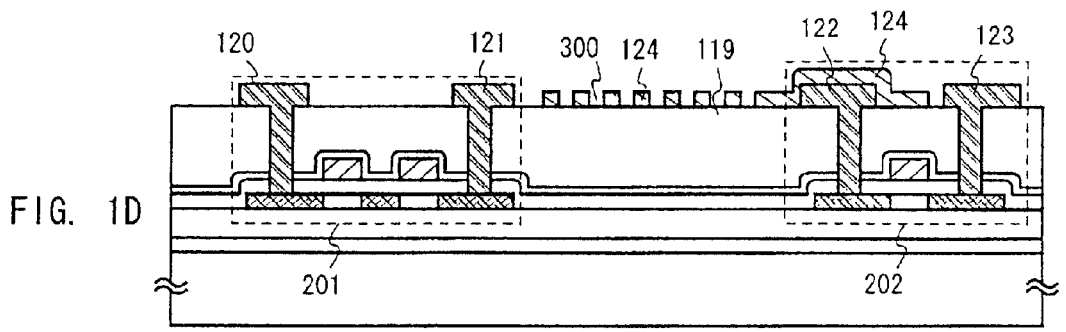

A first interlayer insulating film 119 is formed next from a silicon oxide film having a thickness of 800 nm, as shown in FIG. 1D, contact holes are formed, and wirings 120 to 123 are formed. Another inorganic insulating film may also be used as the first interlayer insulating film 119, and a resin (organic insulating film) may also be used. Metallic wirings having a three layer structure of titanium, aluminum, and titanium are used as the wirings 120 to 123 in the embodiment mode. Any material may of course be used for the wirings, provided that it is a conductive film. The wirings 120 to 123 become TFT source wirings or drain wirings.

A switching TFT 201 and a current control TFT (driver TFT) 202 are completed in this state. Both the TFTs are formed of p-channel TFTs in the embodiment mode. However, the gate electrode may be formed so as to cross the active layer at two locations for the switching TFT 201, which leads to a structure in which two channel forming regions are connected in series. The value of the off current (the electric current flowing when the TFT is in off) can be effectively suppressed by using this type of structure.

Figure 3B:
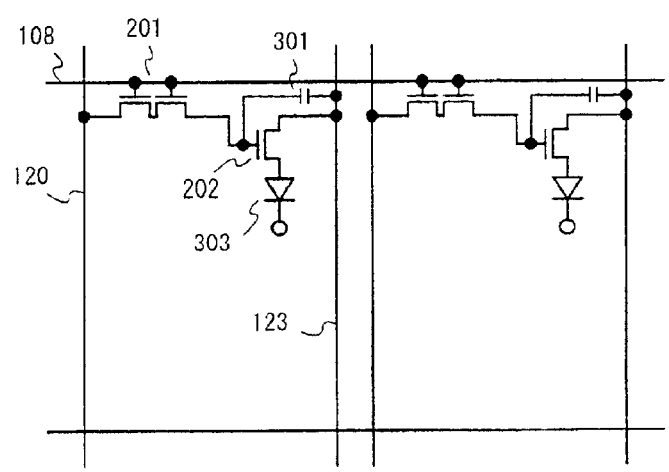

Further, a storage capacitor 301 is formed at the same time, as shown in FIG. 3B. The storage capacitor 301 is formed by: a lower side storage capacitor, formed of a semiconductor layer 302 formed at the same time as the active layers, the gate insulating film 107, and the gate electrode 109; and an upper side storage capacitor formed by the gate electrode 109, the first interlayer insulating film 119, and the wiring 123. Further, the semiconductor layer 302 is electrically connected to the wiring 123.

Figure 1E:
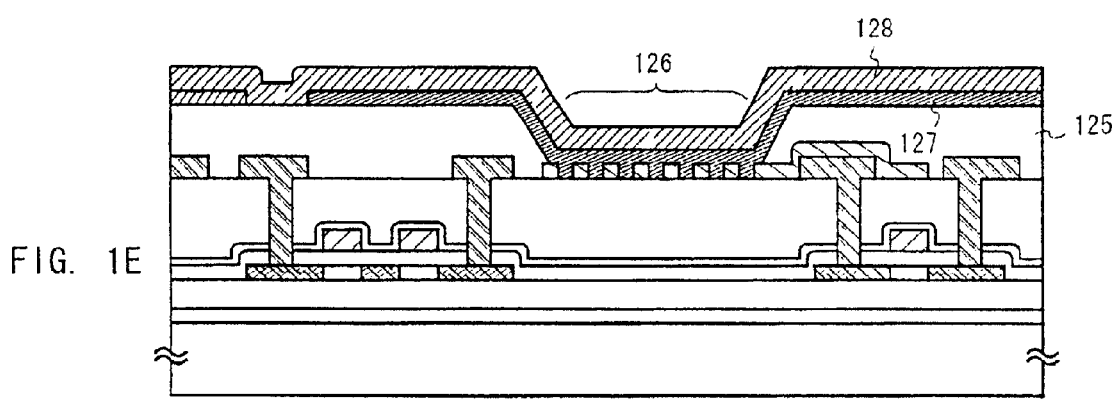

A 100 nm thick metallic film is formed next, as shown in FIG. 1E and patterned, forming a pixel electrode (functioning as an EL element anode) 124. The wiring 122 and the pixel electrode 124 have an ohmic contact at this point. The pixel electrode 124 and the current control TFT 202 are therefore electrically connected. Note that platinum (Pt), chromium (Cr), tungsten (W), or nickel (Ni) can be used as the metallic film. Further, silicon (Si) or germanium (Ge) can be used as the semiconductor film.

When the pixel electrode 124 formed here is seen from above, the structure is as shown in FIG. 3A. However, in the top surface shown in FIG. 3A, an organic EL material and a cathode are not shown.

The pixel electrode 124 has a plurality of slits 300, and is electrically connected to the drain wiring 122 of the current control TFT 202, as shown in FIG. 3A. Further, the pixel electrode 124 also functions as a light shielding film for covering the channel forming regions of the switching TFT 201 and the current control TFT 202.

Figure 4A:
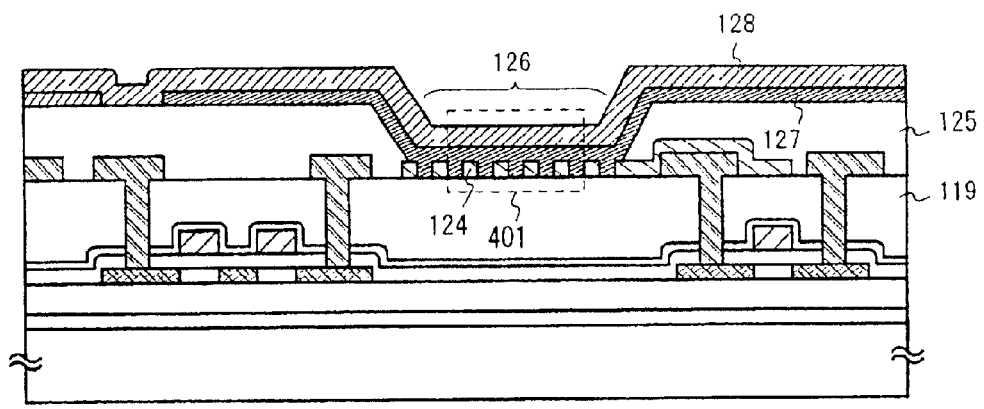
FIGS. 4A and 4B are diagrams showing cross sectional structures of a light emitting device.
Figure 4B:
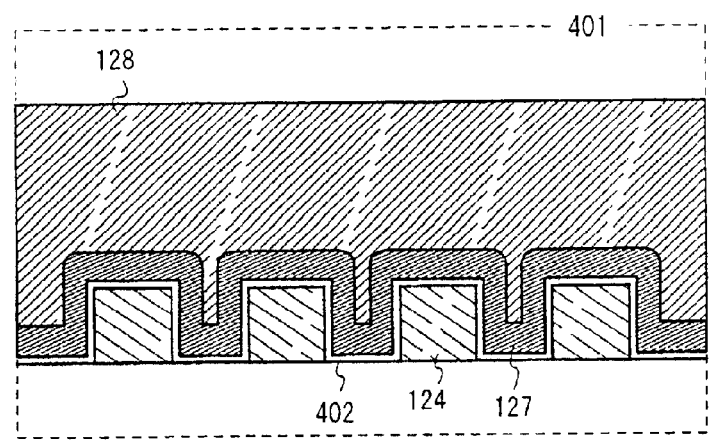

After forming the pixel electrode 124, a second interlayer insulating film 125 is formed of a silicon oxide film having a thickness of 300 nm. An opening portion 126 is then formed, and an insulating film made of an inorganic material is formed with a thickness of 1 to 20 nm (preferably between 3 and 5 nm). This state is shown in FIGS. 4A and 4B. FIG. 4B is an enlargement of a region denoted by reference numeral 401 in FIG. 4A. An insulating film 402 is formed of an inorganic material so as to cover the pixel electrode 124, as shown in FIG. 4B.

An insulating film containing silicon (typically a silicon oxide film, a silicon nitride film, a silicon nitride oxide film, or a film in which aluminum is added to one of these films), a tantalum oxide film, an aluminum oxide film, or a non-crystalline carbon film (including a diamond-like carbon film) can be used as the insulating film 402 made of an inorganic material. It is preferable that the film thickness be thin to an extent that a tunnel current flows, and be set from 1 to 20 nm (preferably between 3 and 5 nm).

An organic EL layer 127 does not directly contact the first interlayer insulating film 119 when a structure shown in FIG. 4B is used. This is an effective structure when a resin film is used as the first interlayer insulating film 119. It is also possible, of course, to omit the insulating film 402 formed of an inorganic material.

The organic EL layer 127 and a cathode 128 are then formed with thicknesses of 70 nm and 300 nm, respectively, by evaporation. A lamination structure of a 20 nm thick hole injecting layer and a 50 nm thick light emitting layer is used as the organic EL layer 127 in the embodiment mode. Other known structures in which a pole injecting layer, a pole transporting layer, an electron transporting layer, or an electron injecting layer is combined with a light emitting layer may also be used.

In the embodiment mode, CuPc (copper phthalocyanine) is used as the pole injecting layer. In this case, copper phthalocyanine is first formed so as to cover all of the pixel electrodes, and then a red color light emitting layer, a green color light emitting layer, and a blue color light emitting layer are formed for each pixel corresponding to the color red, green, or blue. Differentiation of regions formed may be performed using a shadow mask during evaporation. Color display thus becomes possible.

Note that $Alq_3$ (tris-8-aluminum quinolinolate complex) is used as a parent material of the light emitting layer when forming the green color light emitting layer, and that quinacridon or coumarin 6 is added as a dopant. Further, $Alq_3$ is used as a parent material of the light emitting layer when forming the red color light emitting layer, and DCJT, DCM1, or DCM2 is added as a dopant. Furthermore, $BAlq_3$ (a 5 coordinated complex possessing a mixed ligand of 2-methyl-8-quinolinol and phenol dielectric) is used as a parent material of the light emitting layer when forming the blue color light emitting layer, and perilene is added as a dopant.

It is not necessary to limit the present invention to the above stated organic materials, of course, and it is also possible to use known low molecular weight organic EL materials, high molecular weight organic EL materials, and inorganic EL materials. An application method can also be used when high molecular weight organic EL materials are used.

An EL element (denoted by reference numeral 303 in FIG. 3B) composed of the pixel electrode (anode) 124, the insulating film 402 made of an inorganic material, the organic EL layer 127, and the cathode 128 is formed. The EL element functions as a light emitting element in the embodiment mode.

Next, as shown in FIG. 2A, a substrate 130 for fixing the element (hereafter referred to as a fixing substrate) is attached by a first adhesive 129. A flexible plastic film is used as the fixing substrate 130 in the embodiment mode, but a glass substrate, a quartz substrate, a plastic substrate, a silicon substrate, or a ceramic substrate may also be used. Note that PES (polyethylene sulfile), PC (polycarbonate), PET (polyethylene terephthalate), or PEN (polyethylene naphthalate) can be used as the plastic film.

Further, it is necessary to use a material which has selectivity with respect to the peeling layer 102, during later removal of the peeling layer 102, as the first adhesive 129. An insulating film made of resin can typically be used, and polyimide is used in the embodiment mode. However, acrylic, polyamide, and epoxy resin may also be used. Note that, seen from the EL element, when the first adhesive 129 is placed on the observer side (the side of the user of the light emitting device), it is necessary to use a material through which light passes.

The EL element can be completely cutoff from the atmosphere by performing the process of FIG. 2A. Deterioration of the organic EL material due to oxidation can thus be almost completely controlled, and the reliability of the EL element can be greatly increased.

Next, as shown in FIG. 2B, the entire substrate on which the EL element is formed is exposed to a gas containing a halogen fluoride, and removal of the peeling layer 102 is performed. Note that halogen fluoride indicates a substance shown by the chemical formula $XF_n$ (where X is a halogen other than fluorine, and n is an integer. Chlorine fluoride (ClF), chlorine trifluoride ($ClF_3$), bromine fluoride (BrF), bromine trifluoride ($BrF_3$), iodine fluoride (IF), or iodine trifluoride ($IF_3$) can be used.

Chlorine trifluoride ($ClF_3$) is used as the halogen fluoride in the embodiment mode, and nitrogen is used as a dilution gas. Argon, helium, or neon may also be used as the dilution gas. Both flow rates may be set to 500 sccm ($8.35 \times 10^{-6}$ $m^3$/s), and the reaction pressure may be set from 1 to 10 Torr ($1.3 \times 10^2$ to $1.3 \times 10^3$ Pa). Further, room temperature (typically between 20 and 27° C.) may be used as the process temperature.

The silicon film is etched in this case, but the plastic film, the glass substrate the polyimide film and the silicon oxide film are not etched. In other words, the peeling layer 102 is selectively etched by exposure to the chlorine trifluoride gas, and is completely removed. Note that the active layers 105 and 106, similarly formed of silicon films, are covered by the gate insulating film 107 and therefore not exposed to the chlorine trifluoride gas and are not etched.

The peeling layer 102 is etched gradually from the exposed edge portion in the embodiment mode, and the element forming substrate 101 and the insulating film 103 are separated at the point where the peeling layer 102 is completely removed. The TFTs and the EL elements are formed by laminating thin films, and remain as moved to the fixed substrate 130.

Note that the peeling layer 102 is etched from the edge portion here, but if the element forming substrate 101 becomes large, the amount of time for completely removing the peeling layer 102 becomes long, and this is not preferable. It is therefore preferable to implement the embodiment mode for cases in which the element forming substrate 101 has a diagonal equal to or less than 3 inches (preferably a diagonal equal to or less than 1 inch).

After the TFTs and EL element are moved to the fixed substrate 103, a second adhesive 131 is formed, and a plastic film 132 is joined as shown in FIG. 2C. An insulating film made of resin (typically polyimide, acrylic, polyamide, or epoxy resin) may be used as the second adhesive 131, and an insulating film made of an inorganic material (typically silicon oxide film) may also be used. Note that it is necessary to use a material through which light passes when the second adhesive 131 is positioned on the observer side, seen from the EL element.

The TFTs and the EL element are thus moved from the glass substrate 101 to the plastic film 132. As a result, a flexible EL display device which is sandwiched by the two plastic films 130 and 132 can be obtained. The thermal expansion coefficients are equal to each other if the fixing substrate (the plastic film here) 130 and the joining substrate (the plastic film here) 132 are made of the same material, and therefore the influence of stress deformations due to temperature fluctuations can be reduced.

A metallic film or a semiconductor film can be used as the EL element anode in the light emitting device of the present invention, and therefore it is possible to reduce defects during film formation, such as the generation of refuse, compared with a conventional conductive oxide film. The throughput during manufacturing steps is therefore increased, and it is possible to reduce production costs.

In addition, an EL display device manufactured in accordance with the embodiment mode requires only six photo-lithography masks, an extremely small number, and high throughput, low production cost can be achieved. Further, for an EL display device thus formed, the TFTs formed can be used as semiconductor elements without being limited by the heat resistance properties of the plastic substrates, and therefore this can be made extremely high performance.

Figure 15:
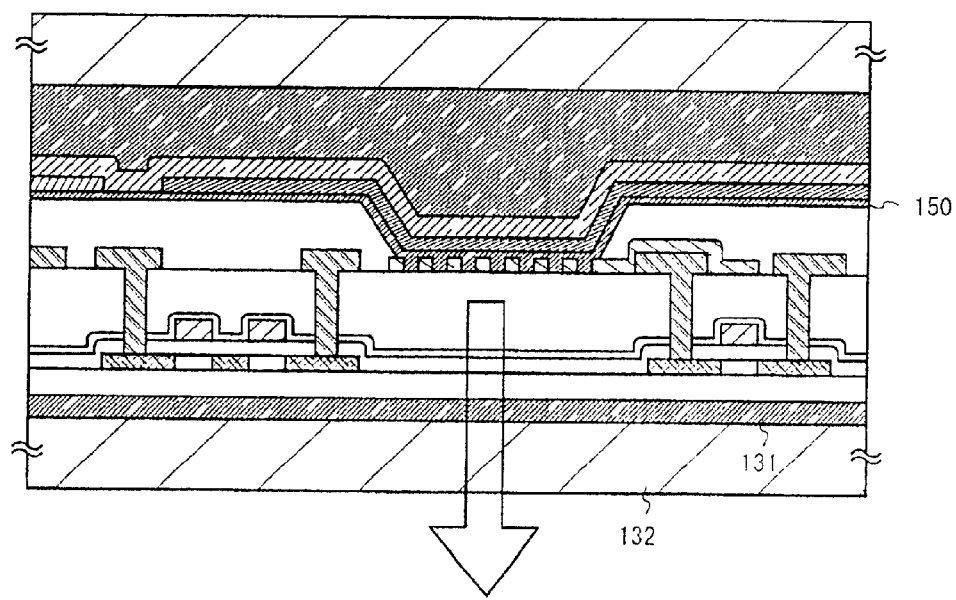
FIGS. 15 and 16 are diagrams showing cross sectional structures of a light emitting device.
Figure 16:
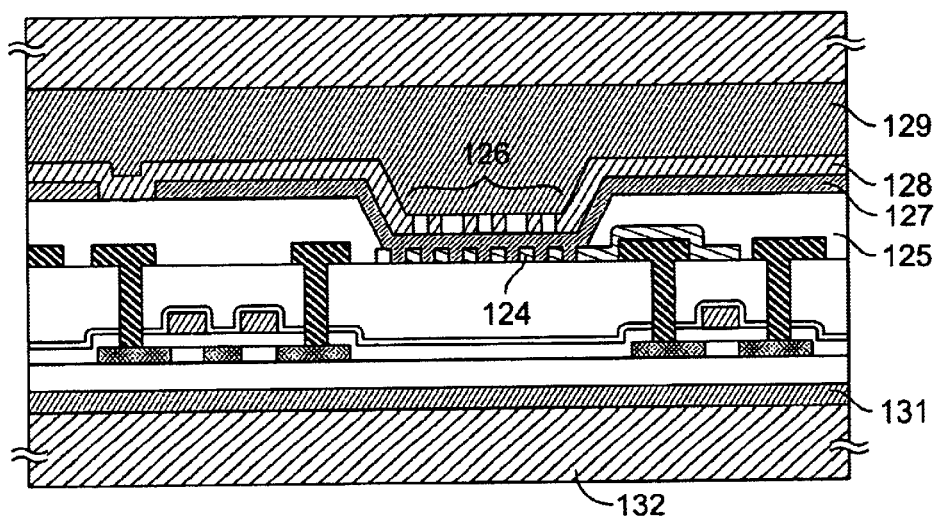

Moreover, a conductive charge injecting layer may be formed between an EL layer and an electrode having slits. For example, as shown in FIG. 15, a polyacetylene film including iodine or boron 150 may be formed between an anode having slits and an EL layer. The charge injecting layer also functions as a leveling layer.

Note that the constitution of the present invention need not be limited to that of the embodiment mode. A slit is formed in a cathode or in an anode according to the present invention, and other structures may have any type of structure. For example, the present invention is not limited to an active matrix display device, and can also be applied to a passive matrix display device.

[Embodiment 1]

A light emitting device having a pixel portion with a structure differing from that of FIGS. 1A to 3B is explained in Embodiment 1. FIGS. 5A to 5C, and FIG. 6 are used in the explanation.

Processing is first performed in accordance with the manufacturing steps of FIG. 1 up through FIG. 1D. However, a slit is not formed in a pixel electrode 501 in Embodiment 1. Further, platinum is used as a material for forming the pixel electrode 501 in Embodiment 1. (See FIG. 5A.)

Figure 5A:
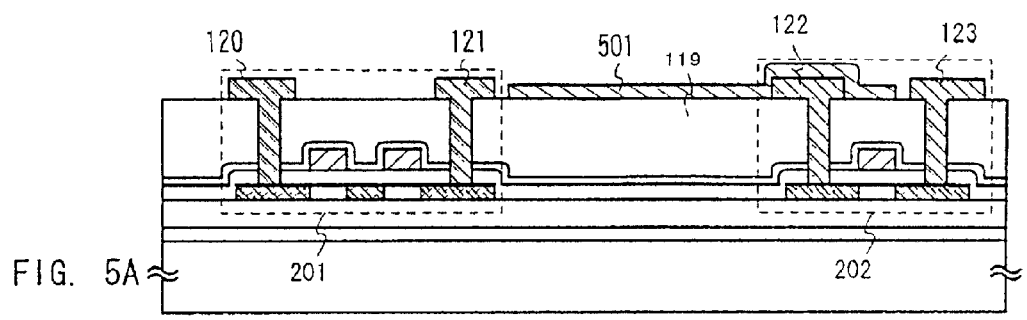
FIGS. 5A to 5C are diagrams showing a process of manufacturing a light emitting device.
Figure 5B:
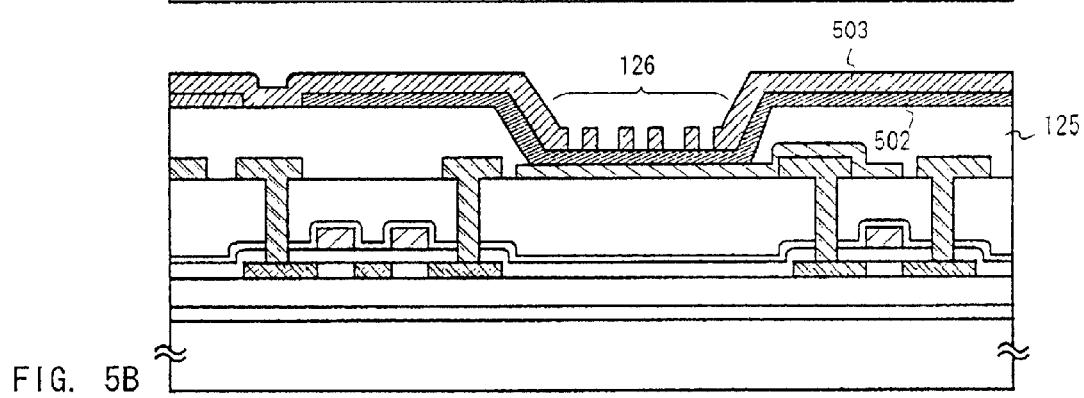

The second interlayer insulating film 125 is formed next, as explained in the embodiment mode of the present invention, and the opening portion 126 is formed, and an organic EL layer 502 is formed. The EL layer 502 may be formed in accordance with the embodiment mode. Further, a cathode 503 is formed on the EL layer 502. An aluminum film to which lithium has been added is used as the cathode 503 in Embodiment 1. Note that evaporation is used for the film formation of the cathode 503, and that a cathode having a slit is formed in Embodiment 1 by using a shadow mask. A top view of the state of FIG. 5B is shown in FIG. 6.

Figure 5C:
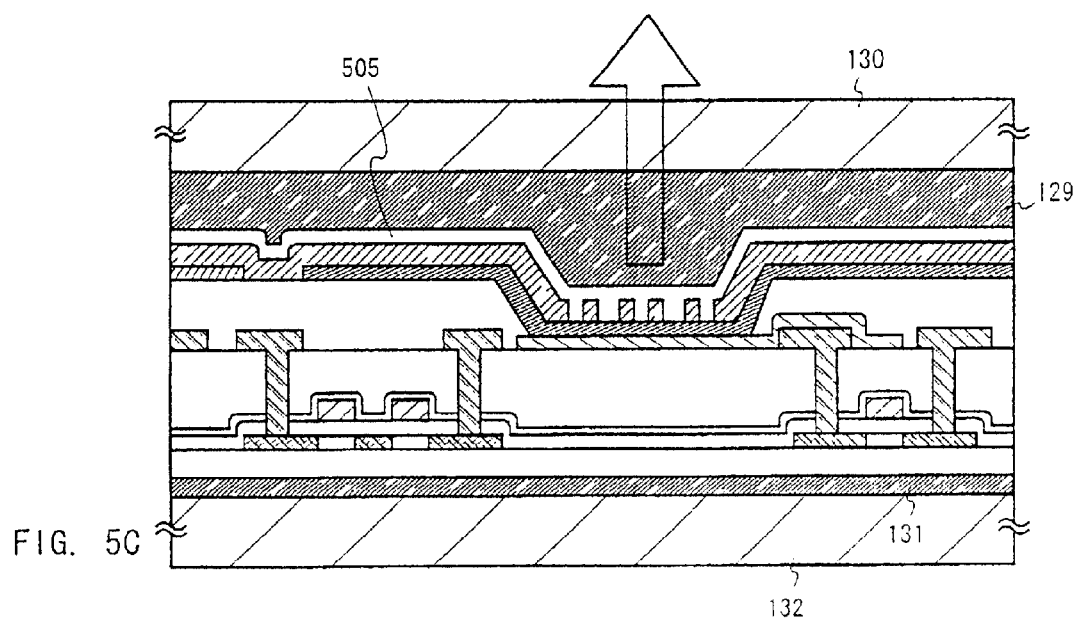
Figure 6:
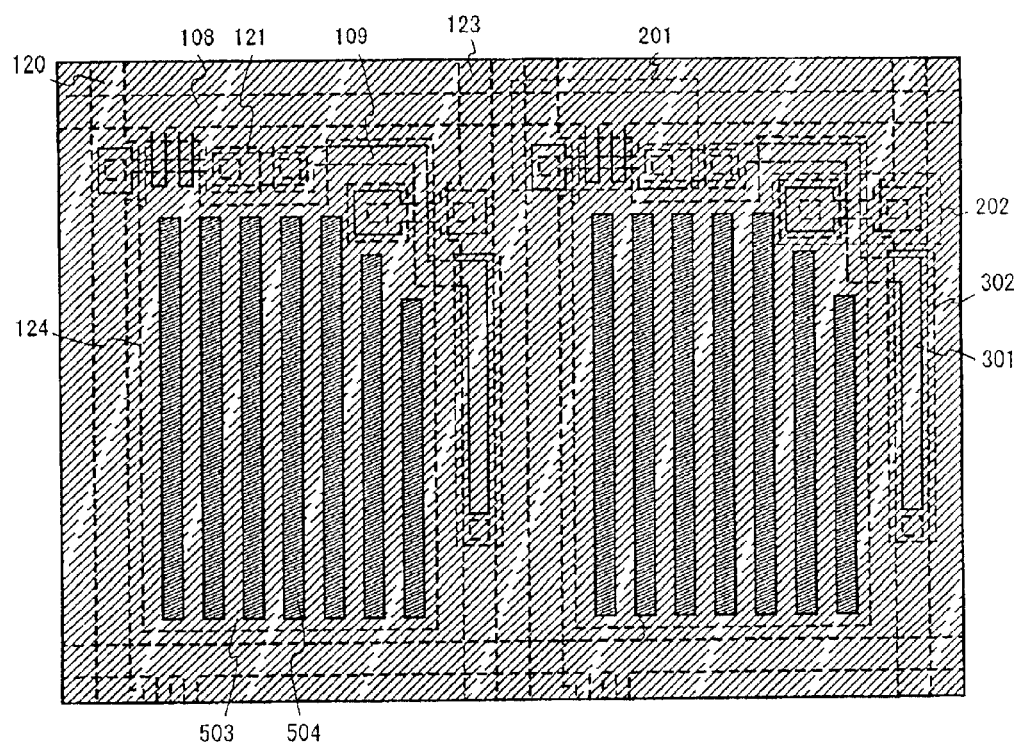
FIG. 6 is a diagram showing a top surface structure of a light emitting device.

Reference numeral 503 in FIG. 6 denotes the cathode, and a plurality of slits 504 are formed in the cathode 503. In this case, the EL layer formed under the cathode 503 is exposed only in the slit 504 portions. A passivation film 505 is then formed as shown in FIG. 5C, covering the cathode 503.

An insulating film made of an inorganic material can be used as the passivation film 505. A silicon nitride film having a thickness of 300 nm is used in Embodiment 1, resulting in a structure in which the organic EL layer 502 is prevented from contacting the atmosphere. It is preferable that the passivation film 505 be formed in succession after forming the cathode 503, without exposure to the atmosphere.

The fixing substrate 130 is then joined by the first adhesive 129, as explained in the embodiment mode, and the complete substrate on which the EL element is formed is exposed to a gas containing a halogen fluoride, preforming removal of the peeling layer 102. Chlorine trifluoride ($ClF_3$) is used as the halogen fluoride in Embodiment 1, and nitrogen is used as a dilution gas. The embodiment mode of the present invention may be referred to regarding other process conditions.

Then, after moving the TFTs and the EL element to the fixing substrate 130, the plastic film 132 is joined by the second adhesive 131. The TFTs and the EL element are thus moved from the glass substrate 101 to the plastic film 132, and the EL light emitting device shown in FIG. 5C is obtained.

[Embodiment 2]

In Embodiment 2, formation of a DLC (diamond-like carbon) film in one or both surfaces of the fixing substrate and/or the joining substrate is effective. However, the transitivity drops if the film thickness is too thick, and therefore the film thickness may be set equal to or less than 50 nm (preferably between 10 and 20 nm).

The DLC film has a Raman spectral distribution with an asymmetric peak at approximately 1550 $cm^{-1}$, and a shoulder at approximately 1300 $cm^{-1}$. Further, it shows a hardness of 15 to 25 Pa when measured using a microhardness meter.

The DLC film has a larger hardness compared to a plastic substrate, and has a larger thermal conductivity, and is therefore effective when formed as a protecting film for surface protection and thermal diffusion.

It is therefore possible to form the DLC film in advance before joining the plastic substrate, or to form the DLC film after joining the plastic substrate. Whichever structure is used, the DLC film formation may be performed using sputtering or ECR plasma CVD.

[Embodiment 3]

Figure 7:
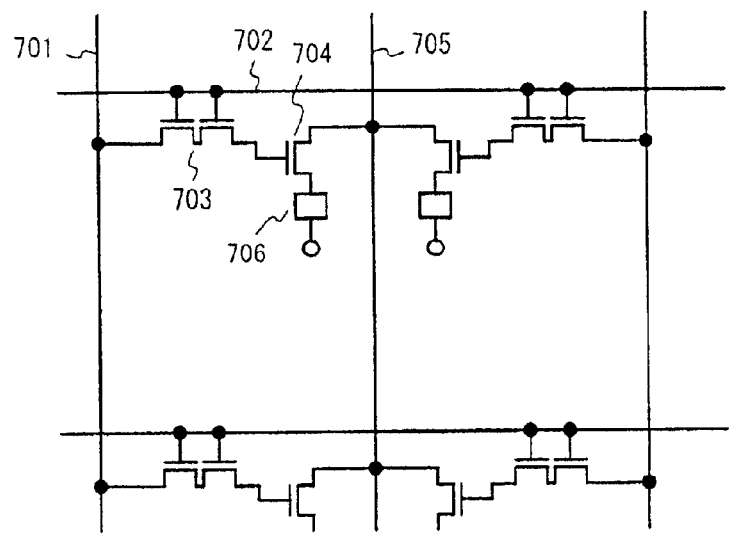
FIG. 7 is a diagram showing a circuit configuration of a light emitting device.

An EL light emitting device of the present invention can be given with a pixel portion having the circuit configuration shown in FIG. 7. In FIG. 7, reference numeral 701 denotes a source wiring, reference numeral 702 denotes a gate wiring, 703 denotes a switching TFT, 704 denotes a current control TFT, 705 denotes a current supply line, and reference numeral 706 denotes an EL element. The switching TFT 703 and the current control TFT 704 are manufactured by p-channel TFTs in Embodiment 3. One of the switching TFT 703 and the current control TFT 704 may be an n-channel TFT, of course, and both may also be n-channel TFTs.

Note that the same role as the capacitor 301 of FIGS. 3A and 3B is supplemented by a gate capacitor of the current control TFT 704. This is because one frame period (or one field period) is short when performing time-division gray-scale display in accordance with digital drive so that an electric charge can be maintained by only the gate capacitor of the current control TFT.

Note that it is possible to implement the constitution of Embodiment 3 by combining it with the constitution of Embodiment 1 or Embodiment 2.

[Embodiment 4]

Figure 8:
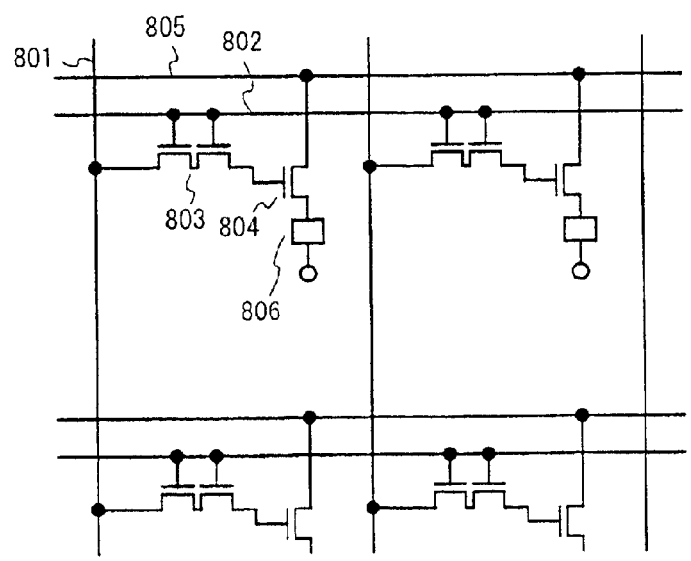
FIG. 8 is a diagram showing a circuit configuration of a light emitting device.

The circuit structure of the pixel portion shown in FIG. 7 in Embodiment 3 may also have the circuit structure shown in FIG. 8. In FIG. 8, reference numeral 801 denotes a source wiring, reference numeral 802 denotes a gate wiring, 803 denotes a switching TFT, 804 denotes an current control TFT, 805 denotes a current supply line, and reference numeral 806 denotes an EL element. The switching TFT 803 and the current control TFT 804 are manufactured by p-channel TFTs in Embodiment 4. One of the switching TFT 803 and the current control TFT 804 may be an n-channel TFT, of course, and both may also be n-channel TFTs.

Since the gate wiring 802 and the current supply line 805 are formed on different layers at this time, it is effective both are formed so as to overlap with each other, sandwiching an interlayer insulating film. The surface area occupied by the wirings can essentially be shared by using this type of structure, and the effective light emitting surface area of the pixel can be increased.

Note that it is possible to implement the constitution of Embodiment 4 by freely combining it with the constitution of any of Embodiments 1 to 3.

[Embodiment 5]

An external view of an EL light emitting device of the present invention is explained in Embodiment 5. Note that FIG. 9A is a top view of the EL light emitting device of the present invention, and that FIG. 9B is a cross sectional view thereof.

Figure 9A:
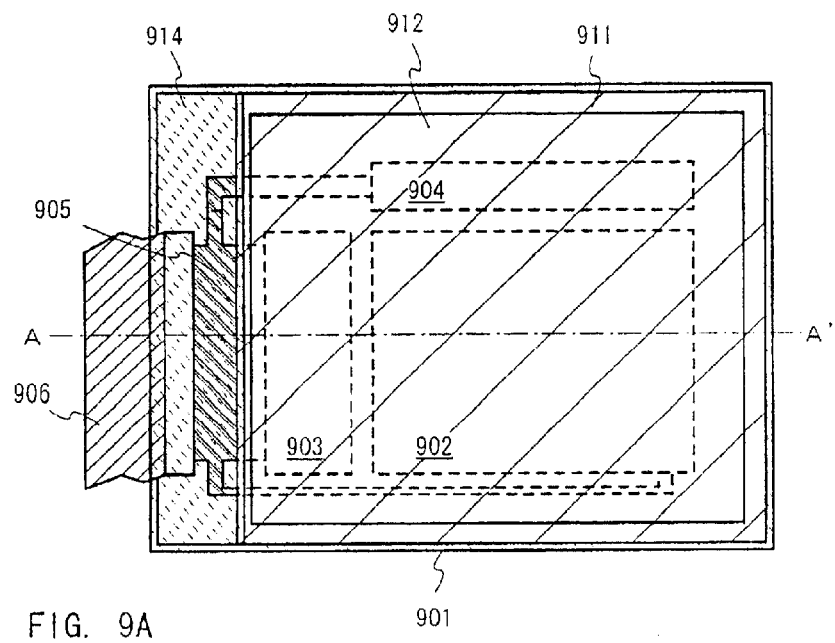
FIGS. 9A and 9B are diagrams showing a top surface structure and a cross sectional structure, respectively, of a light emitting device.

In FIG. 9A, reference numeral 901 denotes an element forming substrate, reference numeral 902 denotes a pixel portion, 903 denotes a source side driver circuit, and 904 denotes a gate side driver circuit, and the driver circuits are connected with external equipment through an FPC (flexible printed circuit) 906 via a wiring 905. A first sealing material 911, a covering material 912, an adhesive 913 (refer to FIG. 9B). and a second sealing material 914 are formed so as to surround the pixel portion 902, the source side driver circuit 903, and the gate side driver circuit 904 at this point.

Figure 9B:
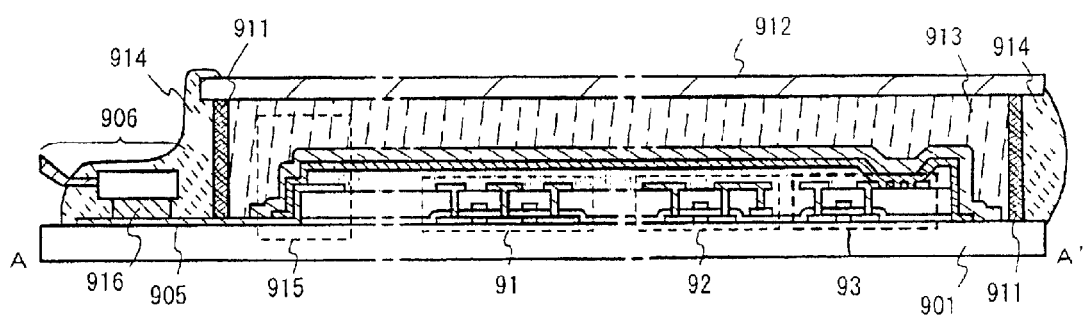

Further, FIG. 9B corresponds to a cross sectional view of FIG. 9A cut along the line A–A'. A TFT 91 forming a driver circuit, a switching TFT 92, and an current control TFT 93 are formed above the element forming substrate 901 (strictly speaking, on an insulating body formed on the element forming substrate 901) at this point. The method of forming the switching TFT 92 and the current control TFT 93 has already been explained, and the explanation is omitted here. A slit is formed in a pixel electrode (anode) of the current control TFT 93 in Embodiment 5. Further, the TFT 91 for forming the driver circuit may be formed by a known CMOS circuit, PMOS circuit, or NMOS circuit.

A cathode of the EL element is electrically connected to the wiring 905 in a region denoted by reference numeral 915. The wiring 905 is a wiring for imparting a predetermined voltage to the cathode, and is electrically connected to the FPC 906 through an anisotropic conductive film 916. In addition, the EL element is surrounded by the first sealing material 911 and the covering material 912 joined to the substrate 901 by the first sealing material 911, and is sealed by the adhesive 913.

Note that spacers may also exist within the adhesive 913. It is possible to give the spacers themselves moisture absorbency provided that they are formed of barium oxide.

Further, when forming the spacers, it is also effective to form a resin film on the cathode as a buffer layer for relieving pressure from the spacers.

Furthermore, an inert gas (a noble gas or nitrogen gas) may be introduced as a substitute for the adhesive 913. It is possible to effectively prevent incursion of oxygen and moisture from the atmosphere provided that the inert gas injection process is performed under a pressurized atmosphere.

The wiring 905 is electrically connected to the FPC 906 through the anisotropic conductive film 916. The wiring 905 transmits signals sent to the pixel portion 902, the source side driver circuit 903, and the gate side driver circuit 904 to the FPC 906. and is electrically connected to external equipment by the FPC 906.

Furthermore, the second sealing material 914 is formed so as to cover exposed portions of the first sealing material 911 and a portion of the FPC 906 in Embodiment 5, becoming a structure in which the EL element is thoroughly cutoff from the atmosphere. Thus, an EL light emitting device having the cross sectional structure of FIG. 9B is obtained. Note that the EL light emitting device of Embodiment 5 may be combined with any of the structures of Embodiments 1 to 4 and manufactured.

[Embodiment 6]

Figure 10A:
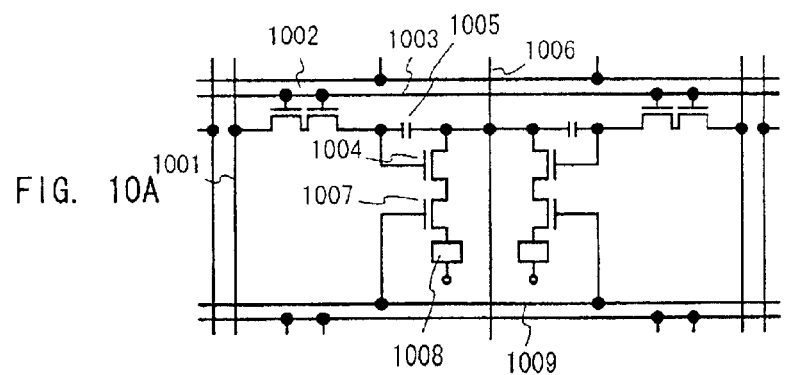
FIGS. 10A and 10B are diagrams showing circuit configurations of a light emitting device.
Figure 10B:
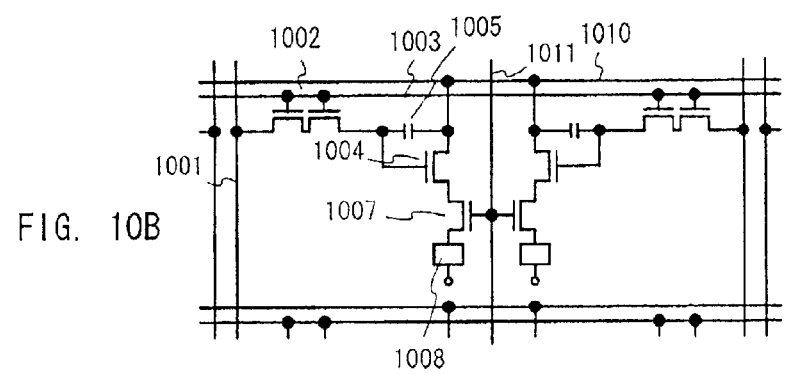

A pixel structure of an EL light emitting device of the present invention is shown in FIGS. 10A and 10B in Embodiment 6. In Embodiment 6, reference numeral 1001 denotes a source wiring of a switching TFT 1002, reference numeral 1003 denotes a gate wiring of the switching TFT 1002, reference numeral 1004 denotes an current control TFT, 1005 denotes a capacitor (it may be omitted), 1006 denotes a current supply line, 1007 denotes a power source control TFT, 1008 denotes an EL element, and reference numeral 1009 denotes a power source control line. The source wiring 1001, the gate wiring 1003, the current supply line 1006, and the power source control line 1009 are formed by the same conductive film on the same layer at this point.

Note that Japanese Patent Application No. Hei 11-341272 may be referenced regarding the operation of the power source control TFT 1007. However, the power source control TFT is made from a p-channel TFT with the same structure as the current control TFT in Embodiment 6.

Further, the power source control TFT 1007 is formed between the current control TFT 1004 and the EL element 1008 in Embodiment 6, but a structure in which the current control TFT 1004 is formed between the power source control TFT 1007 and the EL element 1008 may also be used. Further, it is preferable that the power source control TFT 1007 has the same structure as the current control TFT 1004, or that it is formed of the same active layer and in series with the current control TFT 1004.

FIG. 10A is an example of a case in which the current supply line 1006 is shared between two pixels. Namely, the characteristic is in that two pixels are formed so as to have linear symmetry centered around the current supply line 1006. The number of current supply lines can be reduced in this case, and therefore the pixel portion can be made additionally high definition. Further, FIG. 10B is an example of a case of forming a current supply line 1010 parallel to the gate wiring 1003, and forming a power source control line 1011 parallel to the source wiring 1001.

Note that it is possible to implement the constitution of Embodiment 6 by freely combining it with the constitution of any of Embodiments 1 to 5.

[Embodiment 7]

Figure 11A:
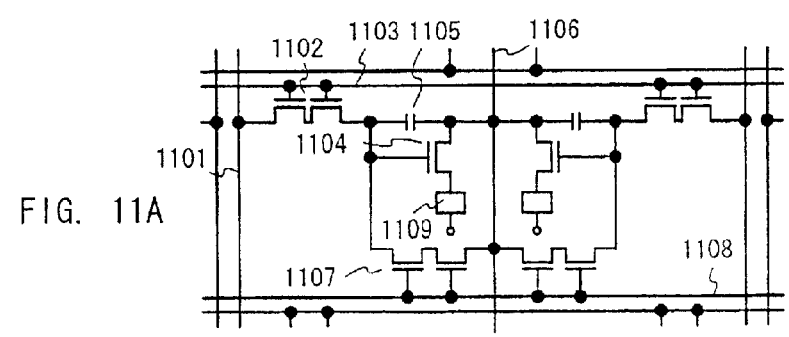
FIGS. 11A and 11B are diagrams showing circuit configurations of a light emitting device.
Figure 11B:
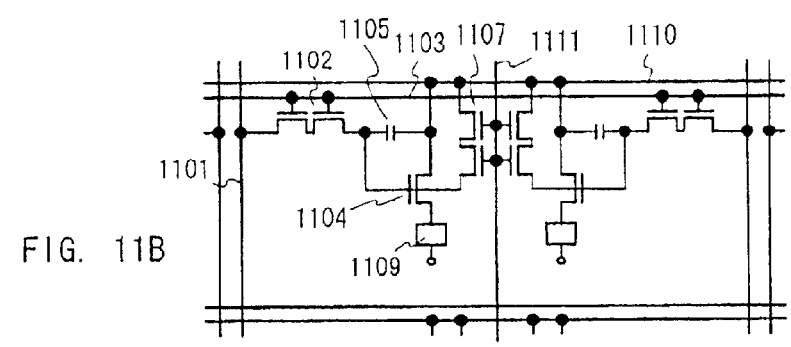

A pixel structure of an EL light emitting device of the present invention is shown in FIGS. 11A and 11B in Embodiment 7. In Embodiment 8, reference numeral 1101 denotes a source wiring of a switching TFT 1102, reference numeral 1103 denotes a gate wiring of the switching TFT 1102, reference numeral 1104 denotes an current control TFT, 1105 denotes a capacitor (it may be omitted), 1106 denotes a current supply line, 1107 denotes an erasure TFT, 1108 denotes an erasure gate wiring, and reference numeral 1109 denotes an EL element. The source wiring 1101, the gate wiring 1103, the current supply line 1106, and the erasure gate wiring 1108 are formed by the same conductive film on the same layer at this point.

Note that Japanese Patent Application No. Hei 11-338786 may be referenced regarding the operation of the erasure TFT 1107. However, the erasure TFT is made from a p-channel TFT with the same structure as the current control TFT in Embodiment 7. Further, the erasure gate wiring is referred to as an erasure gate signal line in Japanese Patent Application No. Hei 11-338786.

A drain of the erasure TFT 1107 is connected to a gate of the current control TFT 1104, and the gate voltage of the current control TFT 1104 can be forcibly changed. Note that it is preferable that the erasure TFT 1107 be a p-channel TFT, and that it have the same structure as the switching TFT 1102 in order to be able to make the off current smaller.

FIG. 11A is an example of a case in which the current supply line 1106 is shared between two pixels. Namely, the characteristic is in that two pixels are formed so as to have linear symmetry centered around the current supply line 1106. The number of current supply lines can be reduced in this case, and therefore the pixel portion can be made additionally high definition. Further, FIG. 11B is an example of a case of forming a current supply line 1110 parallel to the gate wiring 1103, and forming an erasure gate wiring 1111 parallel to the source wiring 1101.

Note that it is possible to implement the constitution of Embodiment 7 by freely combining it with the constitution of any of Embodiments 1 to 5.

[Embodiment 8]

An EL light emitting device of the present invention may have a structure in which several TFTs are formed within a pixel. Examples of forming three TFTs are shown in Embodiments 6 and 7, and four to six TFTs may also be formed. It is possible to implement the present invention without placing limitations on the pixel structure of the EL light emitting device.

Note that it is possible to implement the constitution of Embodiment 8 by freely combining it with the constitution of any of Embodiments 1 to 5.

[Embodiment 9]

A structure in which the insulating film 103 is formed of a silicon nitride film or a silicon nitride oxide film, and in which the protecting film 118 is formed of a silicon nitride film or a silicon nitride oxide film is preferable in the embodiment mode of the present invention.

By using this type of structure, the switching TFT 201 and the current control TFT 202 are sandwiched by silicon nitride films or silicon nitride oxide films, and incursion of moisture and mobile ions from the outside can effectively be prevented.

Further, when using an organic insulating film as the first interlayer insulating film 119, a silicon nitride film or a DLC (diamond-like carbon) film is formed between the first interlayer insulating film 119 and the pixel electrode 124, and in addition, it is preferable to form the above stated silicon nitride film or DLC film on the cathode 128.

By using this type of structure, the EL element 303 is sandwiched by the silicon nitride films or the DLC films, and not only can incursion of moisture and mobile ions from the outside be prevented, but the incursion of oxygen can be effectively prevented. Organic materials such as a light emitting layer within the EL element easily oxidize and deteriorate due to oxygen, and therefore the reliability can be greatly increased by using a structure like that of Embodiment 9.

The overall reliability of an electronic device can therefore be increased by implementing a measure for protecting the TFTs along with implementing a measure for protecting the EL element.

Note that it is possible to freely combine the constitution of Embodiment 9 with the constitution of any of Embodiments 1 to 8.

[Embodiment 10]

Figure 12:
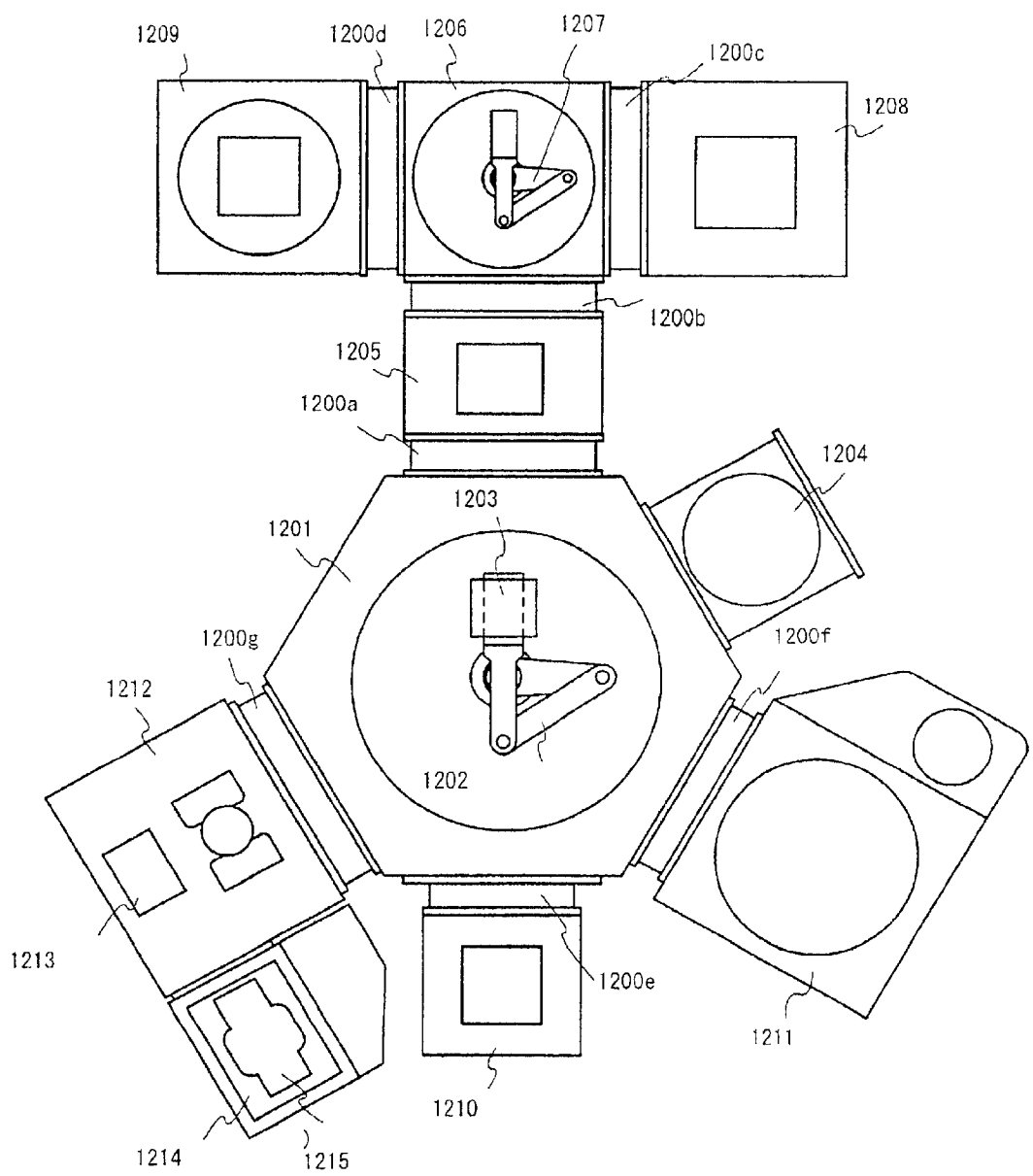
FIG. 12 is a diagram showing a structure of a thin film formation apparatus.

A film formation apparatus for forming an EL layer and a cathode is explained using FIG. 12 in Embodiment 10. In FIG. 12, reference numeral 1201 denotes a conveyor chamber (A), a conveyor mechanism (A) 1202 is prepared in the conveyor chamber (A) 1201, and conveyance of a substrate 1203 is performed. The conveyor chamber (A) 1201 is given a reduced pressure atmosphere, and is cutoff from processing chambers by gates. Delivery of the substrate to each processing chamber is performed by the conveyor mechanism (A) when the gates are opened.

Further, a cryo-pump is used in order to decompress the conveyor chamber (A) 1201. Note that, in the film formation apparatus in FIG. 12, an evacuation port 1204 is formed in a side surface of the conveyor chamber (A) 1201, and that the evacuation pump is set below the evacuation port. This type of structure has an advantage in that maintenance of the evacuation pump becomes easy.

Each processing chamber is explained below. Note that the conveyor chamber (A) 1201 has a reduced pressure atmosphere, and therefore evacuation pumps (not shown in the figure) are prepared in the processing chambers directly connected to the conveyor chamber (A) 1201. A rotary oil pump, a mechanical booster pump, a turbo molecular pump, or a cryo-pump is used as the evacuation pump.

First, reference numeral 1205 denotes a stock chamber for performing substrate setting, and this is referred to as a load-lock chamber. The stock chamber 1205 is cutoff from the conveyor chamber (A) 1201 by a gate 1200a, and a carrier (not shown in the figure), on which the substrate 1203 is set, is arranged in the stock chamber 1205. Further, the above stated evacuation pump and a purge line for introducing a high purity nitrogen gas or noble gas are prepared for the stock chamber 1205.

The substrate 1203 is set in the carrier such that the element forming surface is faced downwardly in Embodiment 10. This is because a face-down method is easily performed when later performing film formation by evaporation. The face-down method refers to a method of film formation in the state that the element forming surface of the substrate is faced downwardly, and problems such as the adhesion of refuse can be suppressed.

Next, reference numeral 1206 denotes a conveyor chamber (B). The conveyor chamber (B) is connected to the stock chamber 1205 through a gate 1200b and is prepared with a conveyor mechanism (B) 1207. Further, reference numeral 1208 denotes a firing chamber (baking chamber), and the firing chamber is connected to the conveyor chamber (B) 1206 through a gate 1200c.

Note that the firing chamber 1208 has a mechanism for inverting the top and bottom surfaces of the substrate. Namely, a substrate conveyed by a face-down method is changed to a face-up method. This is because processing in the next chamber, a spin coating chamber 1209, is to be performed by a face-up method. The substrate is again returned to the firing chamber 1208 and fired after the processing in the spin coating chamber 1209, and is again inverted into a face-down method and returned to the stock chamber 1205.

The spin coating chamber 1209 is connected to the conveyor chamber (B) 1206 through a gate 1200*d*. The spin coating chamber 1209 is a film formation chamber in which a film containing an EL material is formed by applying a solution containing the EL material onto the substrate, and high molecular weight (polymer) organic EL materials are mainly formed. The film formation chamber is always filled with an inert gas such as nitrogen or argon at this time.

Note that the deposited EL material not only is used as a light emitting layer, but also contains a charge injecting layer or a charge transporting layer. Further, any known high molecular weight organic EL material may be used. PPV (polyparaphenylene vinylene) dielectric, PVK (polyvinyl carbazole) dielectric, and polyfluorene dielectric can be given as typical organic EL materials for the light emitting layer. These are also referred to as π conjugate polymers. Further, PEDOT (polythiophene) and PAni (polyaniline) can be given as charge injecting layers.

Next, denoted by reference numeral 1210 is a processing chamber for processing the surface of a cathode or an anode, which becomes a pixel electrode of an EL element (hereafter referred to as a preprocessing chamber), and the preprocessing chamber 1210 is cutoff from the conveyor chamber (A) 1201 by a gate 1200*e*. The preprocessing chamber can be changed in many ways depending upon the manufacturing process of the EL element, and is made to be capable of being heated at from 100 to 120° C. while irradiating ultraviolet light to the surface of the pixel electrode here. This type of preprocess is effective when processing the anode surface of the EL element.

Next, reference numeral 1211 denotes an evaporation chamber for forming a conductive film or an EL material by evaporation, and the evaporation chamber is connected to the conveyor chamber (A) 1201 through a gate 1200*f*. A plurality of evaporation sources can be set in the inside of the evaporation chamber 1211. Further, the evaporation sources are made to evaporate with resistive heating or an electron beam, and film formation can be performed.

The conductive film formed in the evaporation chamber 1211 is a conductive film formed as an electrode of the cathode side of the EL element, and a metal having a small work function, typically an element residing in periodic table group 1 or group 2 (typically lithium, magnesium, cesium, calcium, potassium, barium, sodium, or beryllium), or a metal possessing a work function close to that of these elements can be evaporated. Further, aluminum, copper, and silver can also be evaporated as a low resistance conductive film. In addition, it is also possible to form a conductive film made from a compound of indium oxide and tin oxide, and a conductive film made from a compound of indium oxide and zinc oxide, as a transparent conductive film, by evaporation.

It is possible to form all known EL materials (low molecular weight organic EL materials in particular) in the evaporation chamber 1211. The following can be given as typical light emitting layers: Alq$_3$ (tris-8-aluminum quinolinate complex) and DSA (distilarylene dielectric). Typical examples of charge injecting layers include CuPc (copper phthalocyanine), LiF (lithium fluoride), and acacK (potassium acetylacetonate), and typical examples of charge transporting layers include TPD (triphenylamine dielectric) and NPD (anthracene dielectric).

Further, it is also possible to perform common evaporation of the above EL material with a fluorescing substance (typically coumarin 6, librene, nile red, DCM, and quinacridon). All known material may be used as the fluorescing substance. Further, it is also possible to commonly evaporate the EL material and the periodic table group 1 or group 2 element, giving a portion of the light emitting layer the role of a charge transporting layer or a charge injecting layer. Note that common evaporation refers to a method of evaporation in which evaporation sources are heated at the same time and a different substance is combined at the film formation stage.

Whichever is used, the conveyor chamber (A) 1201 is cutoff by the gate 1200*f*. and film formation of the EL material or the conductive film is performed under a vacuum. Note that film formation is performed by a face-down method.

Next, reference numeral 1212 denotes a sealing chamber (also referred to as an enclosing chamber or a glovebox), and the sealing chamber is connected to the conveyor chamber (A) 1201 by a gate 1200*g*. A process for finally enclosing the EL element in an air-tight manner is performed in the sealing chamber 1212. This process is one for protecting the formed EL element from oxygen and moisture, and a means of mechanical sealing by a covering material, and by a thermosetting resin or ultraviolet hardening resin is used.

The covering material and the substrate on which the EL element is formed or joined using an infrared hardening resin or an ultraviolet hardening resin, the resin is hardened by a thermal process or an ultraviolet light irradiation process, and an air-tight space is formed.

A mechanism 1213 for irradiating ultraviolet light to the inside of the sealing chamber 1212 (hereafter referred to as an ultraviolet light irradiating mechanism) is formed for the film formation apparatus shown in FIG. 12, and this becomes a structure in which an ultraviolet hardening resin is hardened with ultraviolet light emitted from the ultraviolet light irradiating mechanism 1213. It is possible to decompress the inside of the sealing chamber 1212 by attaching an evacuation pump, and it is also possible to pressurize by a high purity nitrogen gas or a high purity noble gas, while purging.

A transfer chamber (pass box) 1214 is connected to the sealing chamber 1212. A conveyor mechanism (C) 1215 is prepared in the transfer chamber 1214, and the substrate on which the EL element is completely sealed in the sealing chamber 1212 is conveyed to the transfer chamber 1214. It is also possible to decompress the transfer chamber 1214 by attaching an evacuation pump. The transfer chamber 1214 is equipment set such that the sealing chamber 1212 is not directly exposed to the atmosphere, and the substrate is removed from the transfer chamber 1214.

By thus using the film formation apparatus shown in FIG. 12, processing up through the complete airtight sealing of the EL element can be performed without exposure to the atmosphere. It becomes possible to manufacture an EL light emitting device having high reliability by using this type of film formation apparatus.

[Embodiment 11]

It is possible to implement the present invention with respect to an EL light emitting device used as a light source such as a back light. When used as a light source, only the light emitting element needs to be formed on the substrate.

In the present invention, by forming a slit in an anode or a cathode of the light emitting element, a metallic film or a semiconductor film can be used as the anode. It is therefore possible to implement the present invention without being constrained by the surface area of the light emitting element.

[Embodiment 12]

The EL light-emitting device formed by implementing the present invention can be used as a display portion or a light source of various kinds of electric equipments. For instance, when appreciating a television broadcast or the like, a display incorporating a 20 to 60 inch diagonal EL light-emitting device of the present invention in a casing may be used. Note that a personal computer display, a television broadcast receiving display, and a display for exhibiting all information such as a display for displaying announcements are included in the displays having the EL light-emitting device incorporated in a casing.

The following can be given as other electronic equipments of the present invention: a video camera; a digital camera; a goggle type display (head mounted display); a navigation system; an audio playback device (such as a car audio stereo or an audio component stereo); a notebook type personal computer; a game apparatus; a portable information terminal (such as a mobile computer, a portable telephone, a portable game machine, or an electronic book); and an image playback device equipped with a recording medium (specifically, device provided with a display portion which plays back images in a recording medium and displays the images). Specific examples of these electronic equipments are shown in FIGS. 13A to 14B.

Figure 13A:
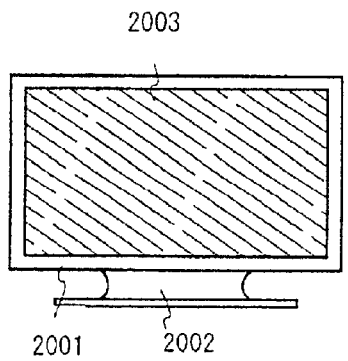
FIGS. 13A to 13F are diagrams showing examples of electronic equipment.

FIG. 13A shows a display having an EL light-emitting device incorporated in a casing, and the display contains a casing 2001, a support stand 2002, a display portion 2003 and the like. The EL light-emitting device of the present invention can be used as the display portion 2003. Such a display is a self-emitting type so that a back light is not necessary. Thus, the display portion can be made thinner than that of a liquid crystal display.

Figure 13B:
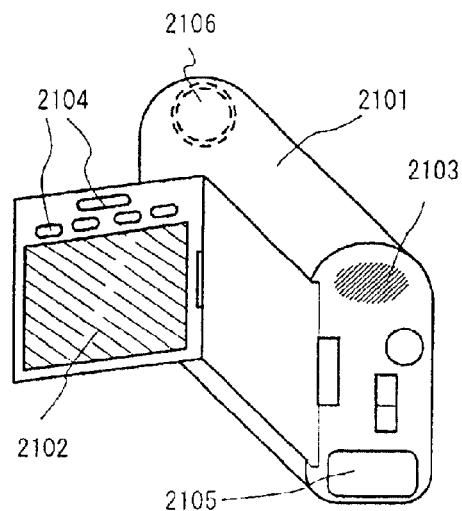

FIG. 13B shows a video camera, and contains a main body 2101, a display portion 2102, a sound input portion 2103, operation switches 2104, a battery 2105, an image receiving portion 2106 and the like. The EL light-emitting device of the present invention can be used as the display portion 2102.

Figure 13C:
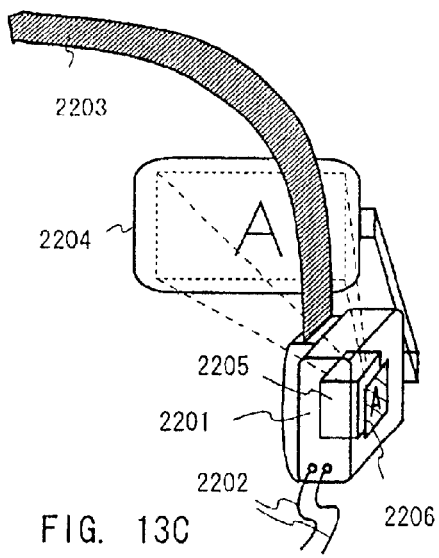

FIG. 13C is a portion (right side) of a head mounted EL display, and contains a main body 2201, a signal cable 2202, a head fixing band 2203, a display portion 2204, an optical system 2205, a light-emitting device 2206 and the like. The present invention can be applied to the EL light-emitting device 2206.

Figure 13D:
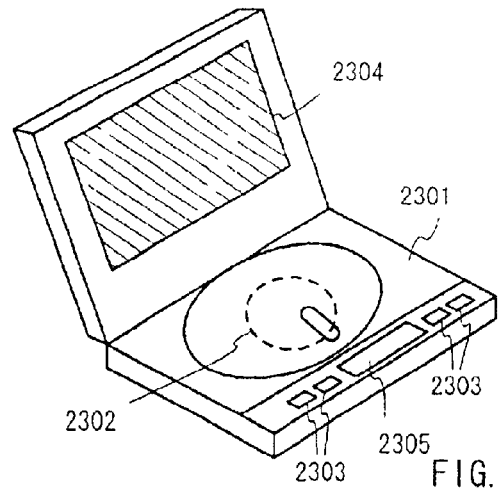

FIG. 13D is an image playback device equipped with a recording medium (specifically, a DVD playback device), and contains a main body 2301, a recording medium (such as a DVD) 2302, operation switches 2303, a display portion (a) 2304, a display portion (b) 2305 and the like. The display portion (a) 2304 is mainly used for displaying image information. The display portion (b) 2305 is mainly used for displaying character information. The EL light-emitting device of the present invention can be used as the display portion (a) 2304 and as the display portion (b) 2305. Note that the image playback device equipped with the recording medium includes devices such as household game machines.

Figure 13E:
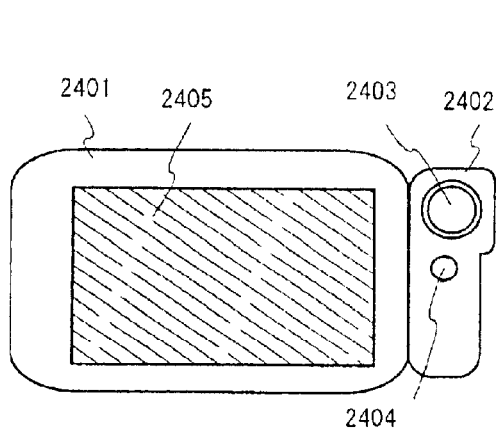

FIG. 13E shows a mobile computer, and contains a main body 2401, a camera portion 2402, an image receiving portion 2403, operation switches 2404, a display portion 2405 and the like. The EL light-emitting device of the present invention can be used as the display portion 2405.

Figure 13F:
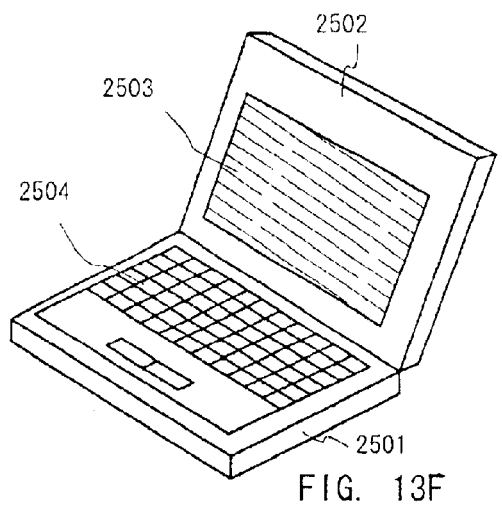

FIG. 13F is a personal computer, and contains a main body 2501, a casing 2502, a display portion 2503, a keyboard 2504 and the like. The EL light-emitting device of the present invention can be used as the display portion 2503.

Note that if the luminance increases in the future, then it will become possible to use the EL light-emitting device of the present invention in a front type or a rear type projector by expanding and projecting light containing output image information with a lens, an optical fiber or the like.

In addition, since the light-emitting device conserves power in the light emitting portion, it is preferable to display information so as to make the light emitting portion as small as possible. Consequently, when using the light-emitting device in a display portion mainly for character information, such as in a portable information terminal, in particular a portable telephone or an audio playback device, it is preferable to drive the light-emitting device so as to form character information by the light emitting portions while non-light emitting portions are set as background.

Figure 14A:
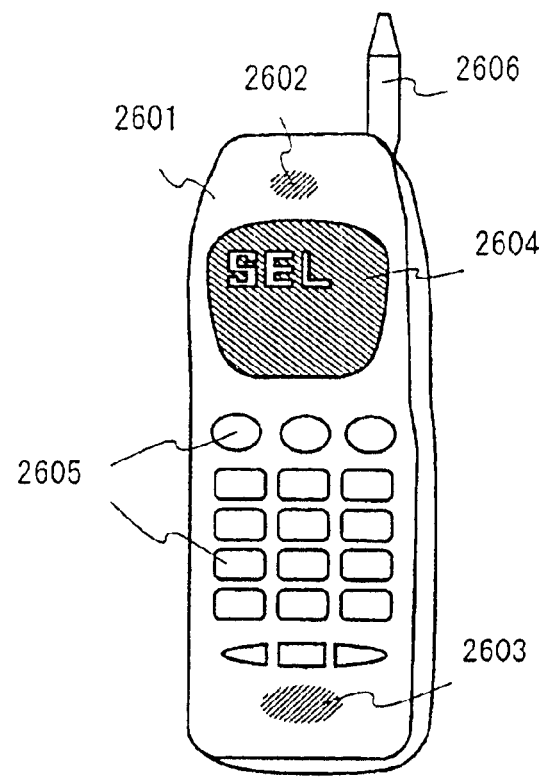
FIGS. 14A and 14B are diagrams showing examples of electronic equipment.

FIG. 14A shows a portable telephone, and contains a main body 2601, a sound output portion 2602, a sound input portion 2603, a display portion 2604, operation switches 2605, and an antenna 2606. The EL light-emitting device of the present invention can be used as the display portion 2604. Note that by displaying white color characters in a black color background, the display portion 2604 can suppress the power consumption of the portable telephone.

Figure 14B:
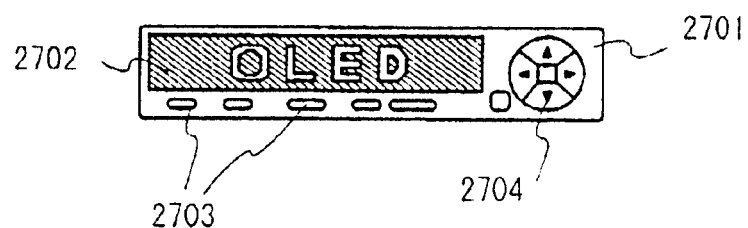

FIG. 14B shows an audio playback device, specifically a car audio stereo and contains a main body 2701, a display portion 2702, and operation switches 2703 and 2704. The EL light-emitting device of the present invention can be used as the display portion 2702. Further, a car audio stereo is shown in Embodiment 12, but a portable type or a household audio playback device may also be used. Note that by displaying white color characters in a black color background, the display portion 2704 can suppress the power consumption. This is especially effective in a portable type audio playback device.

Thus, the application range of the present invention is extremely wide, whereby it may be employed in electric equipments of all fields. Further, the electric equipments of Embodiment 12 may employ the light-emitting device having any of the constitutions of Embodiments 1 through 11.

By forming a slit in an anode or a cathode of a light emitting element, it becomes possible to use a metallic film or a semiconductor film as the anode. A conventionally used conductive oxide film is thus not used as the anode, and it becomes possible to form a light emitting element in which the emitted light may be extracted.

Further, it becomes possible to use a material having a resistance lower than that of an conductive oxide film for the anode, and consequently a light emitting device having high electric current injection efficiency and superior responsibility can be made. In addition, high performance equipment can be obtained using this type of light emitting device as a display portion.

What is claimed is:

1. A semiconductor device comprising:
   a substrate having an insulating surface;
   a semiconductor film over said substrate;
   a gate electrode adjacent to said semiconductor film with a gate insulating film interposed therebetween;
   an interlayer insulating film having a leveled upper surface formed over said semiconductor film and said gate electrode, said interlayer insulating film having at least one contact hole;
   a conductive layer formed over the interlayer insulating film having the leveled upper surface wherein said conductive layer is connected to said semiconductor film through said contact hole;
   a pixel electrode formed over the interlayer insulating film having the leveled upper surface wherein the pixel electrode is contacted to the conductive layer;

a light emitting material formed over said pixel electrode, and a second electrode formed over the light emitting material wherein the light emitting material is interposed between the pixel electrode and the second electrode, wherein the pixel electrode has a plurality of slits where light is passed, and wherein said plurality of slits are located over the leveled upper surface of the interlayer insulating film.

2. A light emitting device according to claim 1, wherein the light emitting material is an EL material.

3. A light emitting device according to claim 1, wherein the conductive layer comprises a three layer structure of titanium, aluminum, and titanium.

4. A light emitting device according to claim 1, wherein the pixel electrode is made of a metallic film or a semiconductor film.

5. A light emitting device according to claim 1, wherein the pixel electrode comprises a material selected from the group consisting of platinum, chromium, tungsten and nickel.

6. A light emitting device according to claim 1, wherein the second electrode comprises material selected from the group consisting of lithium, magnesium, cesium, calcium, potassium, barium, sodium and beryllium.

7. A method of manufacturing a light emitting device comprising:

forming at least one thin film transistor on an insulating body;

forming an insulating film having a leveled upper surface over the thin film transistor;

forming a pixel electrode having a plurality of slits where light is passed over the insulating film having the leveled upper surface and electrically connected to the thin film transistor;

forming a light emitting material over the pixel electrode; and forming a second electrode over the light emitting material wherein the light emitting material is interposed between the pixel electrode and the second electrode, wherein said plurality of slits are located over the leveled upper surface of the interlayer insulating film.

8. A method of manufacturing a light emitting device comprising:

forming a thin film transistor on an insulating body;

forming an insulating film having a leveled upper surface over the thin film transistor;

forming a pixel electrode over the insulating film having the leveled upper surface and electrically connected to the thin film transistor;

forming a light emitting material over the pixel electrode; and forming a second electrode over the light emitting material wherein the light emitting material is interposed between the pixel electrode and the second electrode, wherein a portion of the second electrode and the pixel electrode have a plurality of slits and said portion of the second electrode overlapping with the pixel electrode, and wherein said plurality of slits of the portion of the second electrode and the pixel electrode are located over the leveled upper surface of the interlayer insulating film.

9. A light emitting device comprising:

at least one thin film transistor;

an insulating film having a leveled upper surface formed over the thin film transistor, said insulating film having at least one contact hole;

a conductive layer formed over the insulating film having the leveled upper surface wherein said conductive layer is connected to said thin film transistor through said contact hole;

a pixel electrode formed over the insulating film having the leveled upper surface wherein the pixel electrode is contacted to the conductive layer;

a light emitting material formed over the pixel electrode; and a second electrode formed over the light emitting material wherein said light emitting material is interposed between said pixel electrode and said second electrode, wherein the pixel electrode has a plurality of slits where light is passed, and wherein said plurality of slits are located over the leveled upper surface of the interlayer insulating film.

10. A light emitting device according to claim 9, wherein the pixel electrode is made of a metallic film or a semiconductor film.

11. A light emitting device according to claim 9, wherein the pixel electrode comprises a material selected from the group consisting of platinum, chromium, tungsten and nickel.

12. A light emitting device according to claim 9, wherein the second electrode comprises material selected from the group consisting of lithium, magnesium, cesium, calcium, potassium, barium, sodium and beryllium.

13. A light emitting device according to claim 9, wherein the light emitting material is an EL material.

14. A light emitting device according to claim 9, wherein the conductive layer comprises a three layer structure of titanium, aluminum, and titanium.

15. A light emitting device comprising:

at least one thin film transistor;

an insulating film having a leveled upper surface formed over the thin film transistor, said insulating film having at least one contact hole;

a conductive layer formed over the insulating film having the leveled upper surface wherein said conductive layer is connected to said thin film transistor through said contact hole;

a pixel electrode formed over the insulating film having the leveled upper surface wherein the pixel electrode is contacted to the conductive layer;

a light emitting material formed over the pixel electrode; and a second electrode formed over the light emitting material wherein said light emitting material is interposed between said pixel electrode and said second electrode, wherein a portion of the second electrode overlaps with the pixel electrode and the portion of the second electrode and the pixel electrode have a plurality of slits, and wherein said plurality of slits of the portion of the second electrode and the pixel electrode are located over the leveled upper surface of the interlayer insulating film.

16. A light emitting device according to claim 15, wherein the pixel electrode is made of a metallic film or a semiconductor film.

17. A light emitting device according to claim 15, wherein the pixel electrode comprises a material selected from the group consisting of platinum, chromium, tungsten and nickel.

18. A light emitting device according to claim 15, wherein the second electrode comprises material selected from the group consisting of lithium, magnesium, cesium, calcium, potassium, barium, sodium and beryllium.

19. A light emitting device according to claim 15, wherein the light emitting material is an EL material.

20. A light emitting device according to claim 15, wherein the conductive layer comprises a three layer structure of titanium, aluminum, and titanium.

21. A light emitting device comprising:
   at least one thin film transistor;
   an insulating film having a leveled upper surface formed over the thin film transistor;
   a pixel electrode formed over the insulating film having the leveled upper surface wherein the pixel electrode is electrically connected to the thin film transistor;
   a light emitting material formed over the pixel electrode; and
   a second electrode formed over the light emitting material wherein said light emitting material is interposed between said pixel electrode and said second electrode,
   wherein the pixel electrode has a plurality of slits where a light is passed, and
   wherein said plurality of slits are located over the leveled upper surface of the interlayer insulating film.

22. A light emitting device according to claim 21, wherein the pixel electrode is made of a metallic film or a semiconductor film.

23. A light emitting device according to claim 21, wherein the pixel electrode comprises a material selected from the group consisting of platinum, chromium, tungsten and nickel.

24. A light emitting device according to claim 21, wherein the second electrode comprises material selected from the group consisting of lithium, magnesium, cesium, calcium, potassium, barium, sodium and beryllium.

25. A light emitting device according to claim 21, wherein the light emitting material is an EL material.

26. A light emitting device comprising:
   at least one thin film transistor;
   an insulating film having a leveled upper surface formed over the thin film transistor;
   a pixel electrode formed over the insulating film having the leveled upper surface wherein the pixel electrode is electrically connected to the thin film transistor;
   a light emitting material formed over the pixel electrode; and
   a second electrode formed over the light emitting material wherein said light emitting material is interposed between said pixel electrode and said second electrode,
   wherein a portion of the second electrode overlaps with the pixel electrode and the portion of the second electrode and the pixel electrode have a plurality of slits, and
   wherein said plurality of slits of the portion of the second electrode and the pixel electrode are located over the leveled upper surface of the interlayer insulating film.

27. A light emitting device according to claim 26, wherein the pixel electrode is made of a metallic film or a semiconductor film.

28. A light emitting device according to claim 26, wherein the pixel electrode comprises a material selected from the group consisting of platinum, chromium, tungsten and nickel.

29. A light emitting device according to claim 26, wherein the second electrode comprises material selected from the group consisting of lithium, magnesium, cesium, calcium, potassium, barium, sodium and beryllium.

30. A light emitting device according to claim 26, wherein the light emitting material is an EL material.

31. A semiconductor device comprising:
   a substrate having an insulating surface;
   a semiconductor film over said substrate;
   a gate electrode adjacent to said semiconductor film with a gate insulating film interposed therebetween;
   an interlayer insulating film having a leveled upper surface over said semiconductor film and said gate electrode, said interlayer insulating film having at least one contact hole;
   a conductive layer formed over the interlayer insulating film having the leveled upper surface wherein said conductive layer is connected to said semiconductor film through said contact hole;
   a pixel electrode formed over the interlayer insulating film having the leveled upper surface wherein the pixel electrode is contacted to the conductive layer;
   a light emitting material formed over said pixel electrode, and
   a second electrode formed over the light emitting material wherein the light emitting material is interposed between the pixel electrode and the second electrode,
   wherein a portion of the second electrode overlaps with the pixel electrode and the portion of the second electrode and the pixel electrode have a plurality of slits, and
   wherein said plurality of slits of the portion of the second electrode and the pixel electrode are located over the leveled upper surface of the interlayer insulating film.

32. A light emitting device according to claim 31, wherein the pixel electrode is made of a metallic film or a semiconductor film.

33. A light emitting device according to claim 31, wherein the pixel electrode comprises a material selected from the group consisting of platinum, chromium, tungsten and nickel.

34. A light emitting device according to claim 31, wherein the second electrode comprises material selected from the group consisting of lithium, magnesium, cesium, calcium, potassium, barium, sodium and beryllium.

35. A light emitting device according to claim 31, wherein the light emitting material is an EL material.

36. A light emitting device according to claim 31, wherein the conductive layer comprises a three layer structure of titanium, aluminum, and titanium.

37. A light emitting device comprising:
   at least one thin film transistor formed over the substrate;
   an interlayer insulating film formed over the thin film transistor, said insulating film having at least one contact hole;
   a conductive layer formed over the interlayer insulating film wherein said conductive layer is connected to said thin film transistor through said contact hole;
   a first electrode formed over the insulating film wherein the pixel electrode is contacted to the conductive layer;
   a light emitting material formed over the pixel electrode;
   a second electrode formed over the light emitting material wherein said light emitting material is interposed between said first electrode and said second electrode; and
   an opposite substrate, wherein light emitted by said light emitting material passes through the first electrode and the second electrode, the substrate and the opposite substrate to an outside of the light emitting device.

38. A light emitting device according to claim 37, wherein the light emitting material is an EL material.

39. A light emitting device comprising:

at least one thin film transistor formed over the substrate;

an interlayer insulating film formed over the thin film transistor, said insulating film having at least one contact hole;

a conductive layer formed over the interlayer insulating film wherein said conductive layer is connected to said thin film transistor through said contact hole;

a pixel electrode formed over the insulating film wherein the pixel electrode is contacted to the conductive layer;

a light emitting material formed over the pixel electrode; and a second electrode formed over the light emitting material wherein said light emitting material is interposed between said pixel electrode and said second electrode, wherein the pixel electrode has a plurality of slits, and wherein light emitted by said light emitting material passes through the plurality of slits of the pixel electrode and the substrate to an outside of the light emitting device.

40. A light emitting device according to claim 39 wherein the pixel electrode comprises a material selected from the group consisting of platinum, chromium, tungsten and nickel.

41. A light emitting device according to claim 39 wherein the light emitting material is an EL material.

42. A light emitting device according to claim 39 wherein the conductive layer comprises a three layer structure of titanium, aluminum, and titanium.

43. A light emitting device comprising:

at least one thin film transistor;

a first interlayer insulating film formed over the thin film transistor, said insulating film having at least one contact hole;

a conductive layer formed over the first interlayer insulating film wherein said conductive layer is connected to said thin film transistor through said contact hole;

a pixel electrode formed over the interlayer insulating film wherein the pixel electrode is contacted to the conductive layer;

an second interlayer insulating film formed over the pixel electrode, the interlayer insulating film having an opening portion;

a light emitting material formed over the pixel electrode through the opening portion; and a second electrode formed over the light emitting material wherein said light emitting material is interposed between said pixel electrode and said second electrode, wherein the pixel electrode has a plurality of slits, and wherein the plurality of slits of the pixel electrode are formed at least opening portion.

44. A light emitting device according to claim 43 wherein the pixel electrode comprises a material selected from the group consisting of platinum, chromium, tungsten and nickel.

45. A light emitting device according to claim 43 wherein the light emitting material is an EL material.

46. A light emitting device according to claim 43 wherein the conductive layer comprises a three layer structure of titanium, aluminum, and titanium.

* * * * *